(12) United States Patent
Tanno et al.

(10) Patent No.: US 7,898,645 B2
(45) Date of Patent: Mar. 1, 2011

(54) SUBSTRATE TRANSPORT APPARATUS AND METHOD, EXPOSURE APPARATUS AND EXPOSURE METHOD, AND DEVICE FABRICATING METHOD

(75) Inventors: Nobuyoshi Tanno, Miyagi-ken (JP); Takashi Horiuchi, Kumagaya (JP)

(73) Assignees: Zao Nikon Co., Ltd., Katta-gun (JP); Nikon Corporation, Tokyo (JP)

( * ) Notice: Subject to any disclaimer, the term of this patent is extended or adjusted under 35 U.S.C. 154(b) by 970 days.

(21) Appl. No.: 11/398,603

(22) Filed: Apr. 6, 2006

(65) Prior Publication Data
US 2006/0256316 A1 Nov. 16, 2006

Related U.S. Application Data

(63) Continuation of application No. PCT/JP2004/014945, filed on Oct. 8, 2004.

(30) Foreign Application Priority Data

Oct. 8, 2003 (JP) ................ 2003-349549
Oct. 8, 2003 (JP) ................ 2003-349552

(51) Int. Cl.
*G03B 27/52* (2006.01)
*G03B 27/58* (2006.01)
(52) U.S. Cl. .......................... 355/72; 355/30
(58) Field of Classification Search ............ 355/30, 355/53, 72–76; 134/25.1, 68
See application file for complete search history.

(56) References Cited

U.S. PATENT DOCUMENTS

| 4,346,164 | A | | 8/1982 | Tabarelli et al. |
| 4,480,910 | A | | 11/1984 | Takanashi et al. |
| 5,610,683 | A | * | 3/1997 | Takahashi ................. 355/53 |
| 5,686,143 | A | | 11/1997 | Matsukawa et al. |
| 5,715,039 | A | | 2/1998 | Fukuda et al. |
| 5,727,332 | A | * | 3/1998 | Thrasher et al. ............ 34/277 |
| 5,762,749 | A | * | 6/1998 | Suzuki et al. ......... 156/345.22 |
| 5,825,043 | A | | 10/1998 | Suwa |
| 6,437,851 | B2 | | 8/2002 | Hagiwara |
| 6,496,257 | B1 | * | 12/2002 | Taniguchi et al. ......... 356/239.2 |
| 7,077,585 | B2 | | 7/2006 | Ito |
| 7,299,810 | B2 | * | 11/2007 | Sugimoto ................. 134/105 |
| 7,364,626 | B2 | | 4/2008 | Hirose et al. |
| 2002/0163629 | A1 | | 11/2002 | Switkes et al. |

(Continued)

FOREIGN PATENT DOCUMENTS

DE  221 563 A1  9/1983

(Continued)

OTHER PUBLICATIONS

Lin, B.J. "Semiconductor Foundry, Lithography, and Partners." Proceedings of SPIE, vol. 4688, pp. 11-24, 2002.

(Continued)

*Primary Examiner* — Hung Henry Nguyen
(74) *Attorney, Agent, or Firm* — Oliff & Berridge, PLC

(57) ABSTRACT

A substrate transport apparatus, which transports a substrate that has been exposed with an image of a pattern through a projection optical system and a liquid, comprises a substrate support member that supports the substrate, and a liquid removal mechanism that removes the liquid that has adhered to at least one of the substrate support member and at least a portion of the area of the rear surface of the substrate.

18 Claims, 17 Drawing Sheets

U.S. PATENT DOCUMENTS

| | | |
|---|---|---|
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0109237 A1 | 6/2004 | Epple et al. |
| 2004/0114117 A1 | 6/2004 | Bleeker et al. |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068067 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Zaal et al. |
| 2005/0225735 A1 | 10/2005 | Magome et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita et al. |
| 2005/0237501 A1 | 10/2005 | Furukawa et al. |
| 2005/0243291 A1 | 11/2005 | Kim |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straaijer |
| 2005/0264778 A1 | 12/2005 | Lof et al. |
| 2005/0270505 A1 | 12/2005 | Smith |

FOREIGN PATENT DOCUMENTS

| | | |
|---|---|---|
| DE | 224 448 A1 | 7/1985 |
| EP | 0 605 103 A1 | 7/1994 |
| EP | 1 345 261 A1 | 9/2003 |
| EP | 1 601 008 A1 | 11/2005 |
| EP | 1 624 481 A1 | 2/2006 |
| EP | 1 659 620 A1 | 5/2006 |
| JP | A 57-153433 | 9/1982 |
| JP | A 58-202448 | 11/1983 |
| JP | A 59-019912 | 2/1984 |
| JP | A 62-065326 | 3/1987 |
| JP | A 63-157419 | 6/1988 |
| JP | U 4-80052 | 7/1992 |
| JP | U-4-80052 | 7/1992 |
| JP | A 04-305915 | 10/1992 |
| JP | A 04-305917 | 10/1992 |
| JP | A 05-062877 | 3/1993 |
| JP | A-6-104167 | 4/1994 |
| JP | A 06-124873 | 5/1994 |
| JP | A 6-124873 | 5/1994 |
| JP | A 6-168866 | 6/1994 |
| JP | A-6-168866 | 6/1994 |
| JP | A 07-220990 | 8/1995 |
| JP | A 08-316125 | 11/1996 |
| JP | A-8-316125 | 11/1996 |
| JP | A-10-258249 | 9/1998 |
| JP | A 10-303114 | 11/1998 |
| JP | A 10-340846 | 12/1998 |
| JP | A 11-176727 | 7/1999 |
| JP | A 2000-058436 | 2/2000 |
| JP | 2002-16124 | * 1/2002 |
| JP | A-2002-16124 | 1/2002 |
| JP | A 2002-16124 | 1/2002 |
| WO | WO 99/49504 | 9/1999 |
| WO | WO 99/49504 A1 | 9/1999 |
| WO | WO 02/29137 A2 | 4/2002 |
| WO | WO 02/091078 A1 | 11/2002 |

| | | | |
|---|---|---|---|
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A1 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Switkes, M. et al. "Resolution Enhancement of 157nm Lithography by Liquid Immersion." Proceedings of SPIE, vol. 4691, pp. 459-465, 2002.

Switkes, M., et al. "Resolution Enhancement of 157nm Lithography by Liquid Immersion." J. Microlith., Microfab., Microsyst., vol. 1, No. 3, pp. 1-4, 2002.

Owa, Soichi, et al. "Nikon F2 Exposure Tool," slides 1-25, $3^{rd}$ 157nm Symposium, Sep. 4, 2002.

Owa, Soichi. "Immersion Lithography," slides 1-24, Immersion Lithography Workshop, Dec. 11, 2002.

Owa, Soichi, et al. "Immersion Lithography; its Potential Performance and Issues." Proceedings of SPIE, vol. 5040.

Owa, Soichi, et al. "Potential Performance and Feasibility of Immersion Lithography," slides 1-33, NGL Workshop 2003, Jul. 2003.

Owa, Soichi, et al. "Update on 193nm Immersion Exposure Tool," slides 1-38, Immersion Workshop 2004, Jan. 27, 2004.

Owa, Soichi, et al. "Update on 193nm Immersion Exposure Tool," slides 1-51, Litho Forum, Jan. 28, 2004.

Jul. 30, 2009 Office Action in U.S. Appl. No. 11/592,222.

Mar. 1, 2010 Office Action in U.S. Appl. No. 11/592,222.

Sep. 17, 2008 Supplementary European Search Report in European Application No. 04792214.1.

Jan. 11, 2005 International Search Report in Application No. PCT/JP2004/014945, with translation.

Jan. 11, 2005 Written Opinion in Application No. PCT/JP2004/014945, with translation.

Nov. 25, 2008 Office Action in Japanese Application No. 2005-514618, with translation.

Mar. 3, 2009 Office Action in Japanese Application No. 2005-514618, with translation.

Jun. 16, 2009 Notice of Allowance in Japanese Application No. 2005-514618, with translation.

* cited by examiner

SUBSTRATE TRANSPORT APPARATUS AND METHOD, EXPOSURE APPARATUS AND EXPOSURE METHOD, AND DEVICE FABRICATING METHOD

CROSS-REFERENCE TO RELATED APPLICATIONS

This is a Continuation Application of International Application No. PCT/JP2004/014945, filed Oct. 8, 2004, which claims priority to Japanese Patent Application Nos. 2003-349549 and 2003-349552, both filed on Oct. 8, 2003. The contents of the aforementioned applications are incorporated herein by reference.

BACKGROUND OF THE INVENTION

1. Field of the Invention

The present invention relates to a substrate transport apparatus and method, which transports a substrate that has been exposed by a liquid immersion method, an exposure apparatus and method, and a device fabricating method.

2. Description of Related Art

Semiconductor devices and liquid crystal display devices are fabricated by a so-called photolithography technique, wherein a pattern formed on a mask is transferred onto a photosensitive substrate. An exposure apparatus used in this photolithographic process includes a mask stage that supports the mask, and a substrate stage that supports the substrate, and transfers the pattern of the mask onto the substrate via a projection optical system while successively moving the mask stage and the substrate stage. There has been demand in recent years for higher resolution projection optical systems in order to handle the much higher levels of integration of device patterns. The shorter the exposure wavelength used and the larger the numerical aperture of the projection optical system, the higher the resolution of the projection optical system. Consequently, the exposure wavelength used in exposure apparatuses has shortened year by year, and the numerical aperture of projection optical systems has increased. Furthermore, the mainstream exposure wavelength currently is the 248 nm KrF excimer laser, but an even shorter wavelength 193 nm ArF excimer laser is also being commercialized. In addition, as with resolution, the depth of focus (DOF) is important when performing an exposure. The following equations express the resolution R and the depth of focus δ, respectively.

$$R = k_1 \cdot \lambda / NA \quad (1)$$

$$\delta = \pm k_2 \cdot \lambda / NA^2 \quad (2)$$

Therein, λ is the exposure wavelength, NA is the numerical aperture of the projection optical system, and $k_1$ and $k_2$ are the process coefficients. Equations (1) and (2) teach that if the exposure wavelength λ is shortened and the numerical aperture NA is increased in order to enhance the resolution R, then the depth of focus δ narrows.

If the depth of focus δ becomes excessively narrow, then it will become difficult to align the surface of the substrate with the image plane of the projection optical system, and there will be a risk of insufficient margin of focus during the exposure operation. Accordingly, a liquid immersion method has been proposed, as disclosed in, for example, PCT International Publication WO99/49504 below, as a method to substantially shorten the exposure wavelength and increase the depth of focus. This liquid immersion method fills a liquid, such as water or an organic solvent, between the lower surface of the projection optical system and the surface of the substrate, thus taking advantage of the fact that the wavelength of the exposure light in a liquid is 1/n that of in air (where n is the refractive index of the liquid, normally about 1.2-1.6), thereby improving the resolution as well as increasing the depth of focus by approximately n times.

Incidentally, a substrate transport member unloads the substrate, which was exposed by the liquid immersion method, from the substrate stage. At this time, if liquid has adhered to the rear surface of the substrate, then the liquid between the substrate transport member and the substrate forms a lubricating film, and the substrate becomes slippery (easily mispositioned) with respect to the substrate transport member, and there is a possibility of a problem arising wherein the substrate transport member will no longer be able to transport the substrate in the desired state. In addition, if liquid has adhered to the substrate transport member, then that liquid forms a film that causes the substrate to slip with respect to the substrate transport member, and there is consequently a risk that the substrate cannot be transported satisfactorily. If liquid has adhered to the substrate in the case where the substrate transport member holds the substrate by vacuum suction, then there is a possibility that a problem will arise wherein that liquid will infiltrate and damage the vacuum system.

In addition, if the transportation is executed in a state wherein liquid has adhered to the substrate and/or the substrate transport member, then problems arise, such as rusting of the various equipments and/or members in the vicinity of the transport pathway due to the liquid that falls from the substrate during transport, the inability to maintain the cleanliness level of the environment wherein the exposure apparatus is disposed, and the like. Alternatively, there is also the case wherein the fallen liquid can bring on environmental changes (humidity changes) in the vicinity of the exposure apparatus.

If liquid has adhered to the substrate transport member, then there is a possibility that that liquid will adhere to and contaminate the substrate, and, if the liquid that has adhered to the substrate dries before the exposure process, then a trace thereof will remain on the substrate surface, which can cause a deterioration of the quality of the device that is manufactured. In addition, there is a risk that, in a state wherein liquid has adhered to the substrate after the exposure process, for example, if the development process is executed, then it will cause uneven development and the like, and will also cause substrate contamination due to the liquid that has adhered to the substrate and that will collect impurities (dust and the like) present in the atmosphere, thus making it impossible to fabricate a device that has the desired performance.

The present invention is made considering these circumstances, and it is an object of the present invention to provide: a substrate transport apparatus and method, wherein a substrate exposed by the liquid immersion method can be satisfactorily transported in the desired state; an exposure apparatus and method; and a device fabricating method.

DISCLOSURE OF THE INVENTION

To solve the abovementioned problems, the invention according to a first aspect of the invention is a substrate transport apparatus that transports a substrate that has been exposed with an image of a pattern through a projection optical system and a liquid, comprising: a substrate support member that supports the substrate; and a liquid removal mechanism that removes the liquid that has adhered to at least one of the substrate support member and at least a portion of the area of the rear surface of the substrate.

In addition, the invention according to a second aspect of the invention is a substrate transport apparatus that transports a substrate that has been exposed with an image of a pattern through a projection optical system and a liquid, comprising: a substrate transport member that transports the substrate and that has a moisture absorbing material that absorbs the liquid.

In addition, the invention according to a third aspect of the invention is a substrate transport apparatus that transports a substrate that has been exposed with an image of a pattern through a projection optical system and a liquid, comprising: a first liquid removal mechanism that removes liquid that has adhered to a portion of the area of the rear surface of the substrate; and a second liquid removal mechanism that, after the liquid that has adhered to the portion of the area of the rear surface of the substrate has been removed by the first liquid removal mechanism, removes the liquid that has adhered to the front surface of the substrate.

In addition, the invention according to a fourth aspect of the invention is a substrate transporting method that transports a substrate that has been exposed with an image of a pattern through a projection optical system and a liquid, comprising: removing, before supporting the rear surface of the substrate by a substrate support member, liquid that has adhered to a support area, which is supported by the substrate support member, of the rear surface of the substrate.

In addition, the invention according to a fifth aspect of the invention is a substrate transporting method that transports a substrate that has been exposed with an image of a pattern through a projection optical system and a liquid, comprising: removing liquid that has adhered to a portion of the area of the rear surface of the substrate; and removing, after the liquid that has adhered to the portion of the area has been removed, liquid that has adhered to the front surface of the substrate.

According to the present invention discussed above, the substrate can be transported in the desired state when transporting such after the immersion exposure process, and therefore a device having the desired performance can be manufactured.

DETAILED DESCRIPTION OF THE INVENTION

Figure 1:
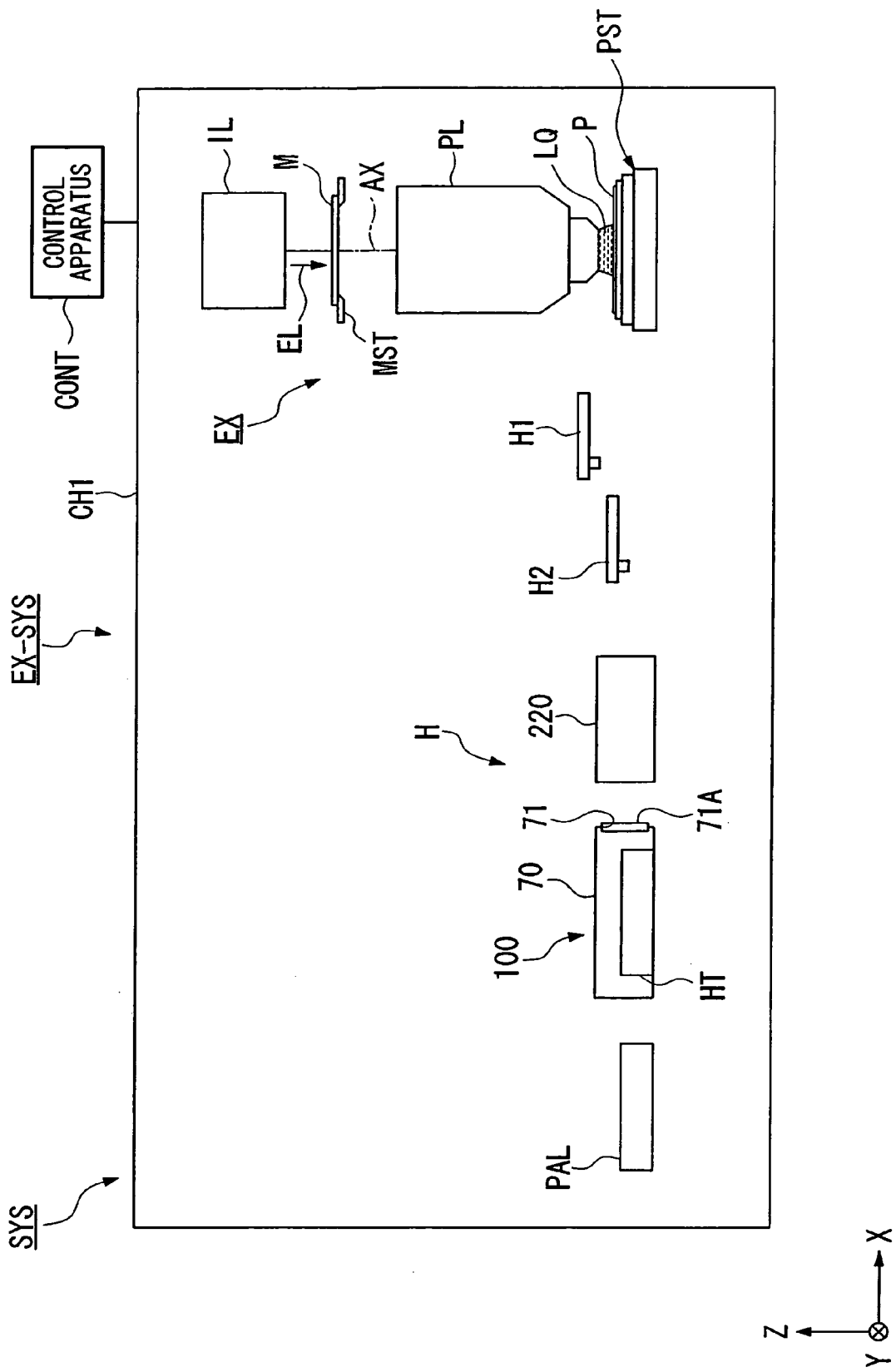
FIG. 1 is a schematic block diagram that shows one embodiment of a device fabrication system as an exposure apparatus of the present invention.
Figure 2:
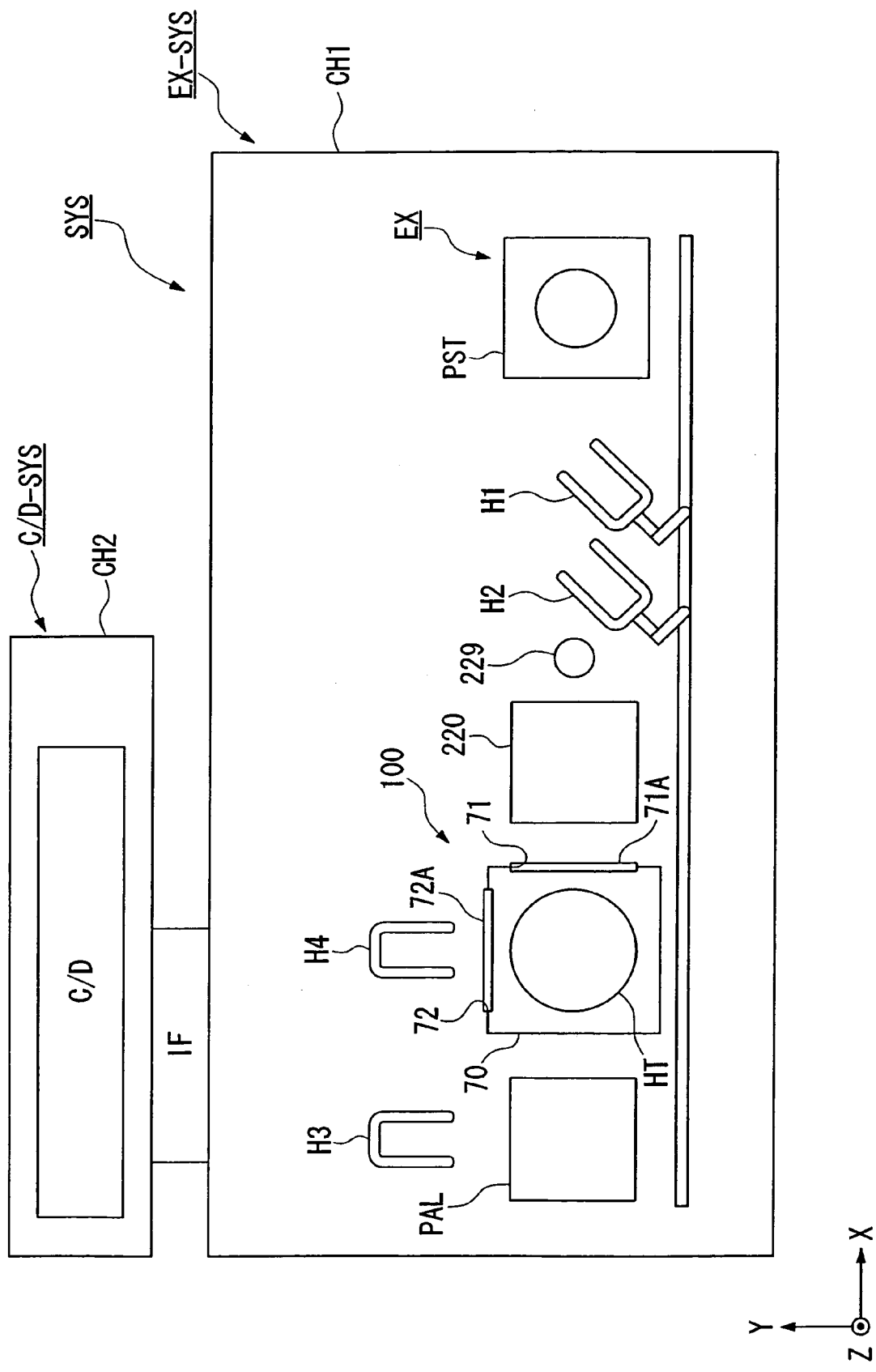
FIG. 2 is a drawing of FIG. 1 viewed from above.

The following explains the embodiments of the present invention, referencing the drawings. FIG. 1 shows one embodiment of a device fabrication system provided with an exposure apparatus of the present invention, and is a schematic block diagram viewed from the side; FIG. 2 is a drawing of FIG. 1 viewed from above.

In FIG. 1 and FIG. 2, a device fabrication system SYS includes an exposure apparatus EX-SYS and a coater and developer apparatus C/D-SYS (refer to FIG. 2). The exposure apparatus EX-SYS includes: an interface part IF (refer to FIG. 2) that forms a connection part to the coater and developer apparatus C/D-SYS; an exposure apparatus main body EX that fills a liquid LQ in a space between a projection optical system PL and a substrate P, and exposes the substrate P by projecting, through the projection optical system PL and the liquid LQ, a pattern formed on a mask onto the substrate P; a transport system H that transports the substrate P between the interface part IF and the exposure apparatus main body EX; a first liquid removal system 100 that is provided on the transport pathway of the transport system H and that removes the liquid LQ adhering to the surface of the substrate P; a second liquid removal system 220 that is provided on the transport pathway and that removes the liquid LQ adhering to the surface of the second arm member H2; and a control apparatus CONT that performs overall control of the operation of the entire exposure apparatus EX-SYS. The coater and developer apparatus C/D-SYS includes: a coater apparatus C that coats the base material of the substrate P, before it has been exposed, with a photoresist (photosensitive agent); and a developer apparatus (processing apparatus) D that performs the development process of the substrate P, after it has been exposed, in the exposure apparatus main body EX. As shown in FIG. 2, the exposure apparatus main body EX is disposed inside a first chamber apparatus CH1, wherein the cleanliness level is controlled. Meanwhile, the coater apparatus C and the developer apparatus D are disposed inside a second chamber apparatus CH2, which is separate from the first chamber apparatus CH1. Furthermore, the first chamber apparatus CH1, wherein the exposure apparatus main body EX is housed, and the second chamber apparatus CH2, wherein the coater apparatus C and the developer apparatus D are housed, are connected via the interface part IF. Here, the coater apparatus C and the developer apparatus D, which are housed inside the second chamber apparatus CH2, are collectively called a "coater and developer main body C/D," in the present invention.

As shown in FIG. 1, the exposure apparatus main body EX includes an illumination optical system IL that illuminates a mask M, which is supported by a mask stage MST, with exposure light EL; the projection optical system PL that projects onto the substrate P the pattern image of the mask M, which is illuminated by the exposure light EL; and a substrate stage PST that supports the substrate P. In addition, the exposure apparatus EX in the present embodiment is a scanning type exposure apparatus (a so-called scanning stepper) that exposes the substrate P with the pattern formed on the mask M while synchronously moving the mask M and the substrate P in the scanning directions and in mutually different directions (opposite directions). In the following explanation, the direction in which the mask M and the substrate P synchronously move (scanning directions) within the horizontal plane is the X axial direction, the direction orthogonal to the X axial direction within the horizontal plane is the Y axial direction (non-scanning direction), and the direction perpendicular to the X axial and the Y axial directions, and that coincide with an optical axis AX of the projection optical system PL, is the Z axial direction. In addition, the rotational (inclined) directions around the X, Y, and Z axes are the θX, θY, and θZ directions, respectively. Furthermore, "substrate" herein includes one on which a semiconductor wafer is coated with a photoresist, and "mask" includes a reticle wherein a device pattern, which is reduction-projected onto the substrate, is formed.

The transport system H includes a first arm member H1 that loads a substrate P, which has not yet been exposed, onto the substrate stage PST, and a second arm member H2 that unloads the substrate P, after it has been exposed, from the substrate stage PST. As shown in FIG. 2, the substrate P, which has not yet been exposed, that was transported from the coater apparatus C is conveyed via the interface part IF to a third arm member H3. The third arm member H3 hands the substrate P over to a prealignment unit PAL. The prealignment unit PAL roughly aligns the substrate P with respect to the substrate stage PST. The first arm member H1 loads the substrate P, which was aligned by the prealignment unit PAL, onto the substrate stage PST. The second arm member H2 unloads the substrate P, for which the exposure process has completed, from the substrate stage PST. The second arm member H2 hands the substrate P, after it has been exposed, over to a holding table HT, which is provided on the transport pathway of that substrate P. The holding table HT constitutes a part of the first liquid removal system 100, and temporarily holds the substrate P. The holding table HT is disposed inside a cover member 70, which is provided with opening parts 71 and 72 for passing the transported substrate P therethrough. The opening parts 71 and 72 are provided with shutter parts 71A and 72A, respectively, which open and close the opening parts 71 and 72. The holding table HT rotatably holds the substrate P; additionally, the substrate P, for which the orientation was changed by the rotation of that holding table HT, is held by a fourth arm member H4 and transferred to the interface part IF. The substrate P that was transported to the interface part IF is conveyed to the developer apparatus D. The developer apparatus D performs the development process to the substrate P.

Furthermore, the first through fourth arm members (transport arm members) H1-H4, the prealignment unit PAL, and the holding table HT are also disposed inside the first chamber apparatus CH1. Here, the first and second chamber apparatuses CH1 and CH2 are each provided with an opening part and a shutter, which opens and closes the opening part, at the portion facing the interface part IF. The shutters are open during the operation of transporting the substrate P to the interface part IF.

The first arm member H1 holds the substrate P that has not yet been exposed and to which the liquid LQ is not adhered, and loads the substrate P onto the substrate stage PST. Meanwhile, the second arm member H2 holds the substrate P, to which there is a possibility that the liquid LQ has adhered after the immersion exposure process, and unloads such from the substrate stage PST. Thus, the first arm member H1, which transports the substrate P to which the liquid LQ is not adhered, and the second arm member H2, which transports the substrate P to which there is a possibility that the liquid LQ has adhered, are used separately, which makes it possible to prevent the adherence of the liquid LQ to the rear surface of the substrate P that is to be loaded on the substrate stage PST, without the liquid LQ adhering to the first arm member H1. Accordingly, even though a substrate holder of the substrate stage PST is constituted so that it holds the substrate P by vacuum suction, it is possible to prevent the problem of the liquid LQ infiltrating a vacuum system, such as a vacuum pump, through a suction hole of the substrate holder.

Figure 3:
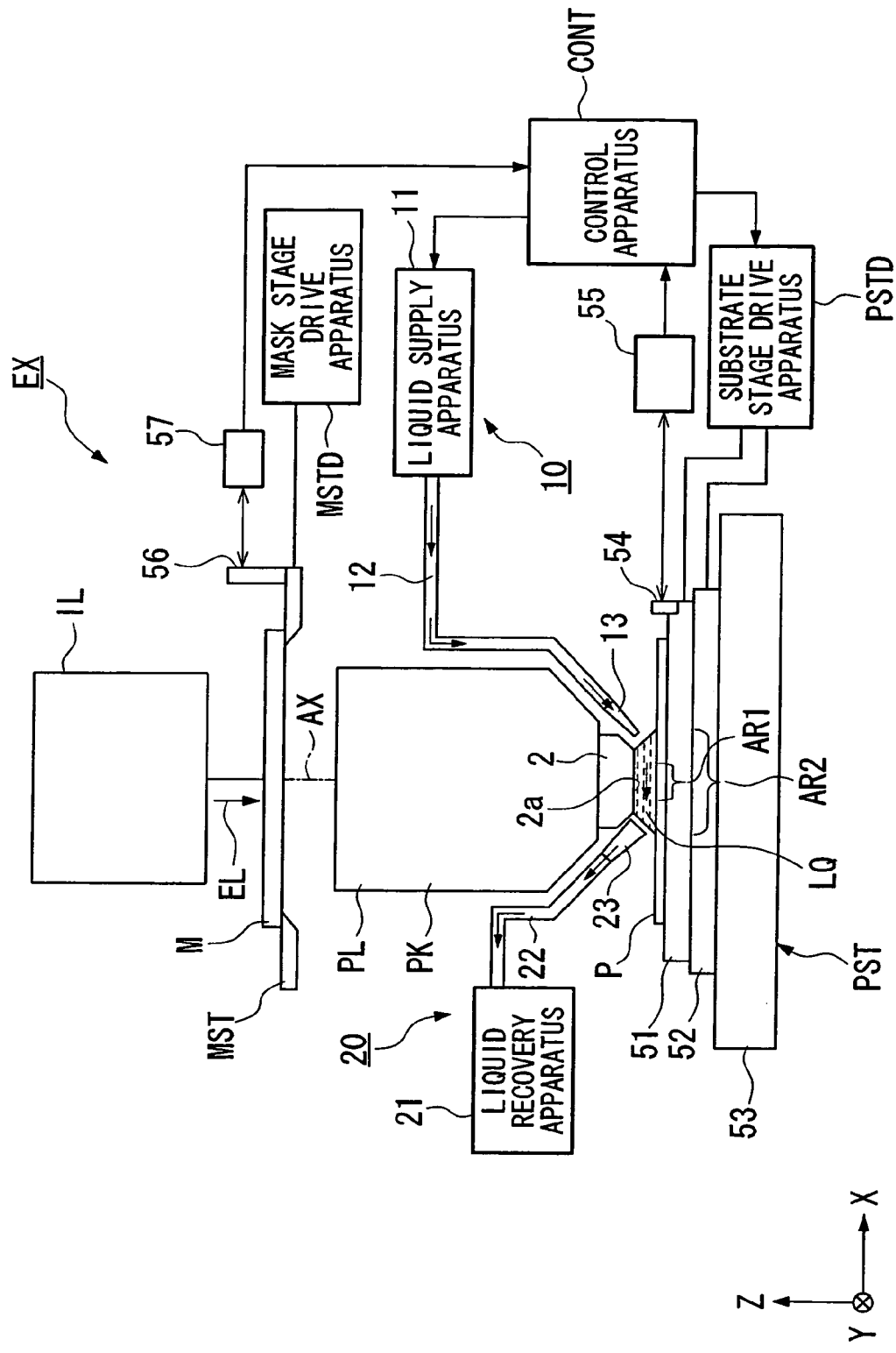
FIG. 3 is a schematic block diagram that shows one embodiment of an exposure apparatus main body that performs the exposure process.

FIG. 3 is a schematic block diagram of the exposure apparatus main body EX.

The illumination optical system IL illuminates the mask M, which is supported by the mask stage MST, with the exposure light EL and includes: an exposure light source; an optical integrator that uniformizes the intensity of the luminous flux emitted from the exposure light source; a condenser lens that condenses the exposure light EL from the optical integrator; a relay lens system; and a variable field stop that sets an illumination region on the mask M illuminated by the exposure light EL to be slit shaped; and the like. The illumination optical system IL illuminates the prescribed illumination region on the mask M with the exposure light EL, which has a uniform luminous flux intensity distribution. Examples of light that can be used as the exposure light EL emitted from the illumination optical system IL include: deep ultraviolet light (DUV light), such the bright lines (g-, h-, and i-lines) and KrF excimer laser light (248 nm wavelength) in the ultraviolet region emitted from, for example, a mercury lamp; and vacuum ultraviolet light (VUV light), such as ArF excimer laser light (193 nm wavelength) and $F_2$ laser light (157 nm wavelength). The present embodiment will be explained by citing an example of a case of using ArF excimer laser light.

The mask stage MST supports the mask M and is two dimensionally movable in the plane perpendicular to the optical axis AX of the projection optical system PL, i.e., in the XY plane, and is finely rotatable in the θZ direction. A mask stage drive apparatus MSTD, such as a linear motor, drives the mask stage MST. The control apparatus CONT controls the mask stage drive apparatus MSTD. A movable mirror 56 is provided on the mask stage MST, and a laser interferometer 57 is provided at a position opposing the movable mirror 56. The laser interferometer measures in real time the position in the two dimensional directions and the rotational angle of the mask stage MST, which holds the mask M, and outputs these measurement results to the control apparatus CONT. The control apparatus CONT drives the mask stage drive apparatus MSTD based on the measurement results of the laser interferometer, and thereby positions the mask M, which is supported by the mask stage MST.

The projection optical system PL projection-exposes the pattern of the mask M onto the substrate P at a prescribed projection magnification β, and is constituted by a plurality of optical elements (lenses, mirrors, and the like), which are housed in a lens barrel PK. In the present embodiment, the projection optical system PL is a reduction system that has a projection magnification β of, for example, ¼ or ⅕. Furthermore, the projection optical system PL may be a unity magnification system or an enlargement system. In addition, an optical element (lens) 2 is exposed to the exterior of the lens barrel PK on the tip side (substrate P side) of the projection optical system PL according to the present embodiment. This optical element 2 is provided so that it is detachable (i.e., replaceable) from the lens barrel PK.

The optical element 2 is made of fluorite. Because fluorite has a high affinity to pure water, the liquid LQ can contact with substantially the entire surface of a tip surface (liquid contact surface) 2a of the optical element 2. Namely, because the liquid (water) LQ supplied in the present embodiment has a high affinity to the liquid contact surface 2a of the optical element 2, the contact degree between the liquid contact surface 2a of the optical element 2 and the liquid LQ is high. Furthermore, the optical element 2 may be made of quartz, which also has a high affinity to water. In addition, the liquid contact surface 2a of the optical element 2 may be given hydrophilic (lyophilic) treatment in order to further raise its affinity to the liquid LQ.

The substrate stage PST supports the substrate P and includes a Z stage 51 that holds the substrate P via a substrate holder, an XY stage 52 that supports the Z stage 51, and a base 53 that supports the XY stage 52. A substrate stage drive apparatus PSTD, such as a linear motor, drives the substrate stage PST. The control apparatus CONT controls the substrate stage drive apparatus PSTD. By driving the Z stage 51, the position of the substrate P held on the Z stage 51 in the Z axial directions (the focus position) and in the θX and θY directions is controlled. In addition, by driving the XY stage 52, the position of the substrate P in the XY direction (the position in a direction substantially parallel to the image plane of the projection optical system PL) is controlled. In other words, the Z stage 51 controls the focus position and the inclination angle of the substrate P, and aligns the surface of the substrate P with the image plane of the projection optical system PL by an auto focus system and an auto leveling system. Further, the XY stage 52 positions the substrate P in the X axial directions and Y axial directions. Furthermore, the Z stage and the XY stage may of course be integrally provided.

A movable mirror 54 is provided on the substrate stage PST (the Z stage 51). In addition, a laser interferometer 55 is provided at a position opposing the movable mirror 54. The laser interferometer 55 measures in real time the position in the two dimensional direction as well as the rotational angle of the substrate P on the substrate stage PST, and outputs these measurement results to the control apparatus CONT. The control apparatus CONT drives the substrate stage drive apparatus PSTD based on the measurement results of the laser interferometer 55, and thereby positions the substrate P supported on the substrate stage PST.

A liquid immersion method is adopted in the present embodiment in order to substantially shorten the exposure wavelength and improve resolution, while also substantially increasing the depth of focus. Consequently, at least while the pattern image of the mask M is being transferred onto the substrate P, the prescribed liquid LQ is filled in the space between the surface of the substrate P and the tip surface 2a of the optical element 2 of the projection optical system PL. As discussed above, the present embodiment is constituted so that the optical element 2 is exposed to the exterior on the tip side of the projection optical system PL, and so that the liquid LQ contacts only the optical element 2. Corrosion and the like of the lens barrel PK, which is made of metal, is thereby prevented. Pure water is used as the liquid LQ in the present embodiment. Pure water can transmit this exposure light EL not only if it is ArF excimer laser light, but also if it is deep ultraviolet light (DUV light), such as the bright lines (g-, h-, and i-lines) and KrF excimer laser light (248 nm wavelength) in the ultraviolet region emitted from, for example, a mercury lamp.

The exposure apparatus main body EX is provided with a liquid supply mechanism 10 that supplies the liquid LQ between the substrate P and the tip surface 2a of the optical element 2 of the projection optical system PL, and a liquid recovery mechanism 20 that recovers the liquid LQ on the substrate P. The liquid supply mechanism 10 supplies the prescribed liquid LQ to the substrate P in order to form an immersion area AR2 thereon, and includes: a liquid supply apparatus 11, which is capable of feeding the liquid LQ; and supply nozzles 13, which are connected to the liquid supply apparatus 11 via a supply pipe 12, that each have a supply port through which the liquid LQ, which is fed from this liquid supply apparatus 11, is supplied to the substrate P. The supply nozzles 13 are disposed close to the surface of the substrate P.

The liquid supply apparatus 11 includes a tank that stores the liquid LQ, a pressurizing pump, and the like, and supplies the liquid LQ to the substrate P through the supply pipe 12 and the supply nozzles 13. In addition, the control apparatus CONT controls the operation wherein the liquid is supplied by the liquid supply apparatus 11, and can control the amount of liquid supplied per unit of time by the liquid supply apparatus 11 to the substrate P. In addition, the liquid supply apparatus 11 includes a mechanism for adjusting the temperature of the liquid LQ, and supplies the substrate P with the liquid LQ, which has a temperature (for example, 23° C.) substantially the same as that inside the chamber that houses the apparatus.

The liquid recovery mechanism 20 recovers the liquid LQ on the substrate P, and includes recovery nozzles 23, which are disposed close to, but not in contact with, the surface of the substrate P, and a liquid recovery apparatus 21, which is connected to the recovery nozzles 23 via a recovery pipe 22. The liquid recovery apparatus 21 includes a vacuum system (suction apparatus), e.g., a vacuum pump, a tank that stores the recovered liquid LQ, and the like, and recovers the liquid LQ on the substrate P through the recovery nozzles 23 and the recovery pipe 22. The control apparatus CONT controls the operation of recovering the liquid by the liquid recovery apparatus 21, and can control the amount of liquid recovered per unit of time thereby.

During scanning exposure, the pattern image of one part of the mask M is projected onto a projection area AR1 that is directly below the optical element 2 at the tip of the projection optical system PL, and the substrate P moves at a velocity $\beta \cdot V$ (where $\beta$ is the projection magnification) in the +X direction (or the −X direction) via the XY stage 52 in synchronization with the movement of the mask M at a velocity V in the −X direction (or the +X direction) with respect to the projection optical system PL. Further, after the exposure of one shot region is complete, the next shot region moves to the scanning start position by stepping the substrate P, and the exposure process is subsequently performed sequentially for each shot region by the step-and-scan system. The present embodiment is set so that the liquid LQ flows along the movement direction of the substrate P.

Figure 4:
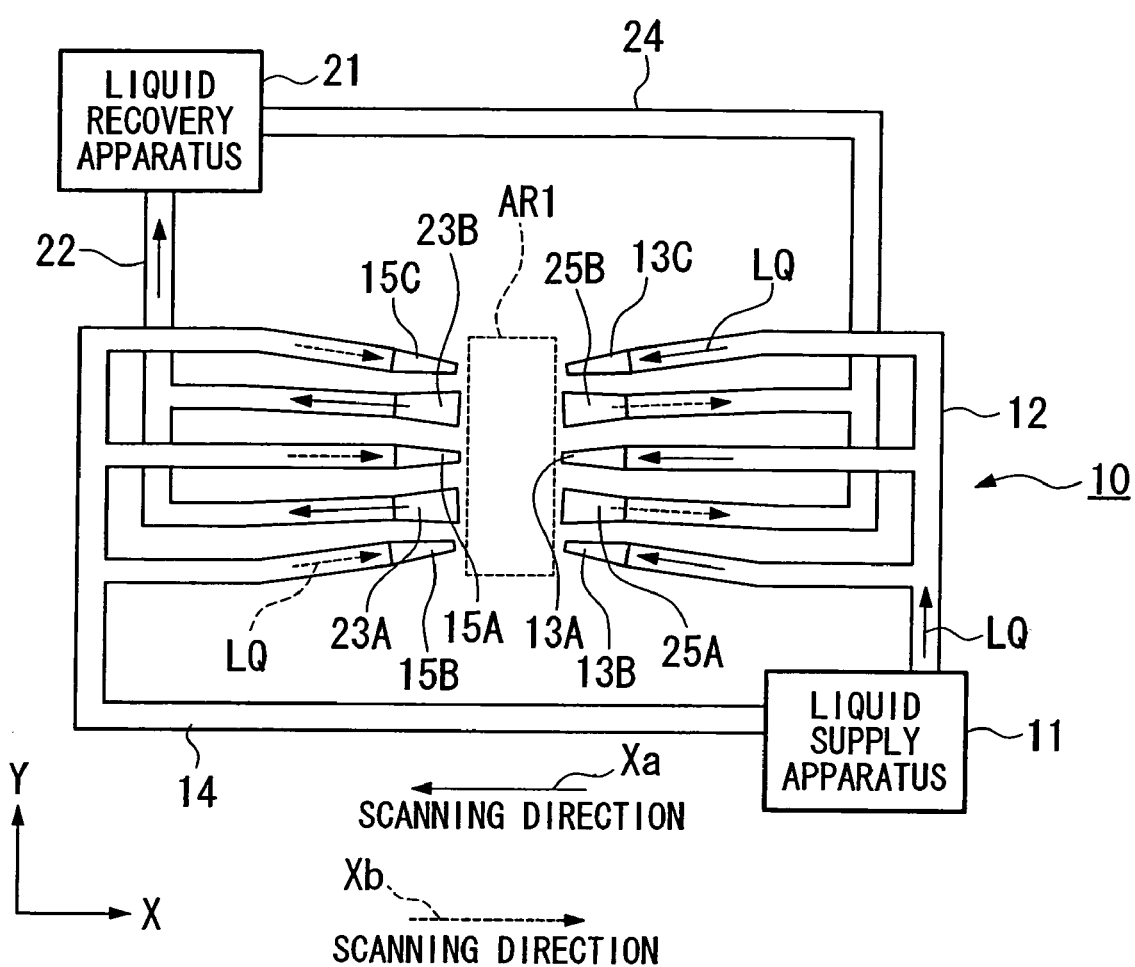
FIG. 4 is a view that shows an example of the arrangement of the supply nozzles and the recovery nozzles.

FIG. 4 shows the positional relationships between the projection area AR1 of the projection optical system PL, the supply nozzles 13 (13A-13C) that supply the liquid LQ in the X axial directions, and the recovery nozzles 23 (23A and 23B) that recover the liquid LQ. In FIG. 4, the shape of the projection area AR1 of the projection optical system PL is a rectangle that is long and thin in the Y axial directions; further, three supply nozzles 13A-13C are disposed on the +X direction side, and two recovery nozzles 23A and 23B are disposed on the −X direction side so that the projection area AR1 is interposed therebetween in the X axial directions. Furthermore, the supply nozzles 13A-13C are connected to the liquid supply apparatus 11 by the supply pipe 12, and the recovery nozzles 23A and 23B are connected to the liquid recovery apparatus 21 by the recovery pipe 22. In addition, supply nozzles 15A-15C and recovery nozzles 25A and 25B are disposed in a positional relationship so that they are rotated substantially 180° with respect to the supply nozzles 13A-13C and the recovery nozzles 23A and 23B. The supply nozzles 13A-13C and the recovery nozzles 25A and 25B are arrayed alternately in the Y axial directions, the supply nozzles 15A-15C and the recovery nozzles 23A and 23B are arrayed alternately in the Y axial directions, the supply nozzles 15A-15C are connected to the liquid supply apparatus 11 by a supply pipe 14, and the recovery nozzles 25A and 25B are connected to the liquid recovery apparatus 21 by a recovery pipe 24.

Furthermore, if scanning exposure is being performed by moving the substrate P in a scanning direction (−X direction) shown by, for example, the arrow Xa, then the liquid LQ is supplied and recovered by the liquid supply apparatus 11 and the liquid recovery apparatus 21 using the supply pipe 12, the supply nozzles 13A-13C, the recovery pipe 22, and the recovery nozzles 23A and 23B. Namely, when the substrate P moves in the −X direction, the liquid LQ is supplied from the liquid supply apparatus 11 through the supply pipe 12 and the supply nozzles 13 (13A-13C) onto the substrate P, is recovered by the liquid recovery apparatus 21 through the recovery nozzles 23 (23A and 23B) and the recovery pipe 22, and thereby flows in the −X direction so that it fills the space between the projection optical system PL and the substrate P. Meanwhile, if scanning exposure is performed by moving the substrate P in a scanning direction (+X direction) shown by the arrow Xb, then the liquid LQ is supplied and recovered by the liquid supply apparatus 11 and the liquid recovery apparatus 21 using the supply pipe 14, the supply nozzles 15A-15C, the recovery pipe 24, and the recovery nozzles 25A and 25B. Namely, when the substrate P moves in the +X direction, the liquid LQ is supplied from the liquid supply apparatus 11 through the supply pipe 14 and the supply nozzles 15 (15A-15C) onto the substrate P, is recovered by the liquid recovery apparatus 21 through the recovery nozzles 25 (25A and 25B) and the recovery pipe 24, and thereby flows in the +X direction so that it fills the space between the projection optical system PL and the substrate P. Thus, the control apparatus CONT uses the liquid supply apparatus 11 and the liquid recovery apparatus 21 to flow the liquid LQ along the movement direction of the substrate P in a direction identical thereto. In this case, the liquid LQ, which is supplied, for example, from the liquid supply apparatus 11 through the supply nozzles 13, flows along with the movement of the substrate P in the −X direction so that it is pulled into the space between the projection optical system PL and the substrate P, and it is therefore possible to easily supply the liquid LQ thereto even if the supply energy of the liquid supply apparatus 11 is small. Furthermore, by switching the direction of flow of the liquid LQ in accordance with the scanning direction, it is possible to fill the liquid LQ between the projection optical system PL and the substrate P, and to obtain a high resolution and great depth of focus regardless of whether the substrate P is scanned in the +X direction or the −X direction.

Figure 5:
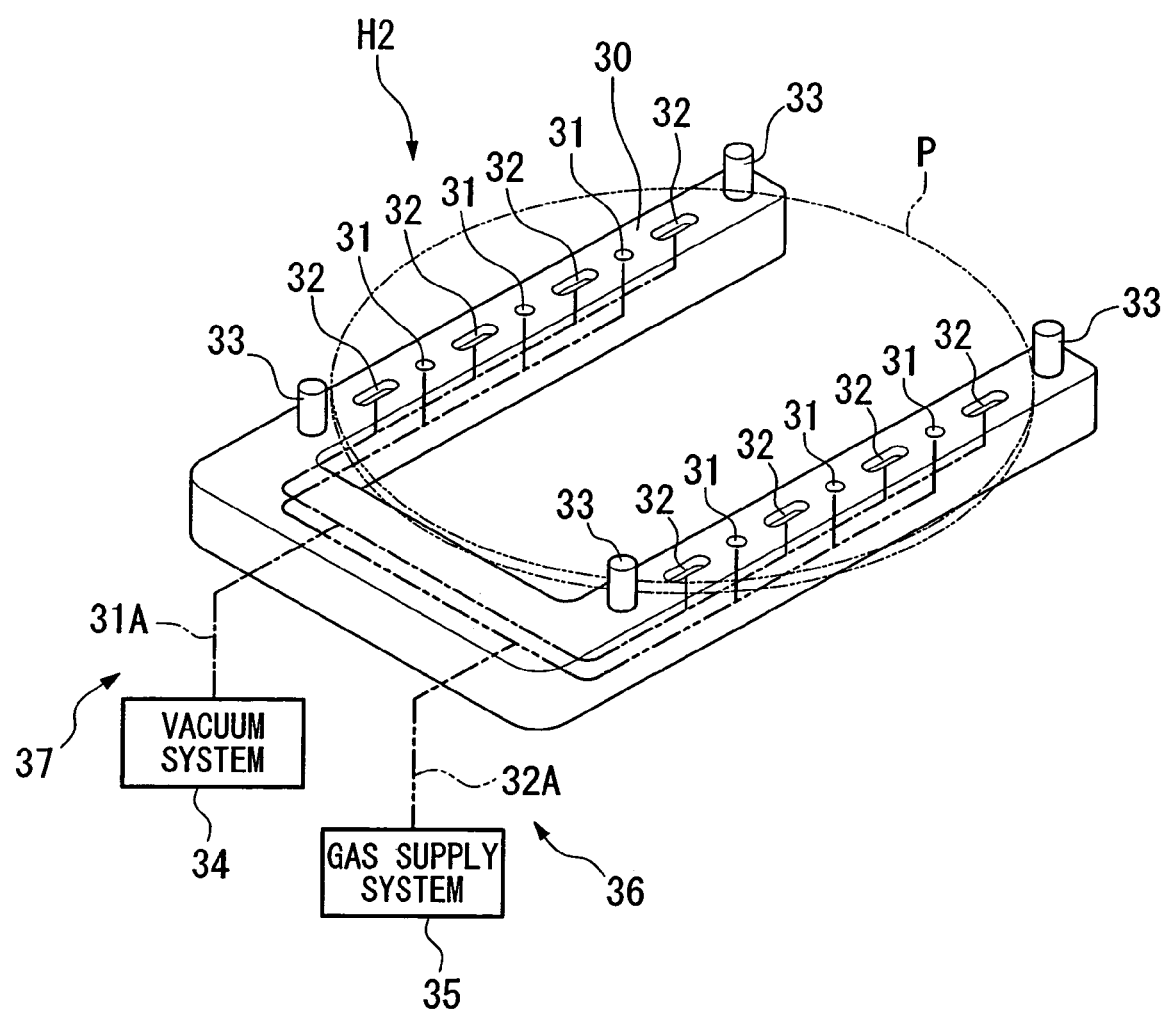
FIG. 5 is a schematic block diagram that shows one embodiment of a transport arm member according to the present invention.

FIG. 5 is a schematic oblique view that shows the second arm member H2, which unloads the substrate P after the completion of the exposure process, on which the liquid LQ has adhered, from the substrate stage PST. In FIG. 5, the second arm member H2 is constituted by a forked hand that supports the rear surface of the substrate P and transports that substrate P. The second arm member H2 has an upper surface (support surface) 30, which opposes the rear surface of the substrate P, and supports the substrate P thereby. A plurality of suction holes 31, which are opening parts for holding the rear surface of the substrate P by suction, are provided in the support surface 30 of the second arm member H2 so that they are evenly spaced at prescribed intervals over substantially the entire area of the support surface 30. A vacuum system (suction mechanism) 34 is connected to the suction holes 31 by a passageway 31A, which is formed inside the second arm member H2. The vacuum system 34 is constituted by a vacuum pump provided to the exposure apparatus main body EX, or a vacuum system in the factory in which the device fabrication system SYS is installed. A suction mechanism 37, which is configured to include the vacuum system 34 and the suction holes 31, activates the vacuum system 34 in order to support the rear surface of the substrate P, and applies suction to the rear surface of the substrate P through the suction holes 31.

In addition, blow holes 32, which are opening parts at positions different from the suction holes 31, are provided in the support surface 30 of the second arm member H2. In the present embodiment, the blow holes 32 are provided and disposed between the suction holes 31, and are provided substantially evenly over the entire area of the support surface 30 of the second arm member H2. A gas supply system 35 is connected to the blow holes 32 via a passageway 32A, which is formed inside the second arm member H2. A gas blowing mechanism (liquid removal mechanism) 36 is configured to include the gas supply system 35 and the blow holes 32. The passageway 32A is provided with a filter that removes foreign matter (waste and oil mist) in the air that is blown against the substrate P. By activating the gas supply system 35, the prescribed gas is blown out from the blow holes through the passageway 32A. In addition, the control apparatus CONT controls the operation of the gas supply system 35, and is capable of adjusting the volume of gas blown out from the blow holes 32 per unit of time by controlling the gas supply system 35.

In addition, protruding portions 33, which are positioning members, are provided at a plurality of prescribed positions on the support surface 30 of the second arm member H2. The protruding portions 33 prevent the occurrence of problems, such as the substrate P becoming mispositioned, falling off the second arm member H2, and the like, when supporting the rear surface of the substrate P by the support surface 30 of the second arm member H2.

The following explains the operation of the exposure apparatus main body EX and the transport system H discussed above.

In the exposure apparatus main body EX, the exposure process is performed for the substrate P, which is held by the substrate stage PST, using the liquid immersion method. After the completion of the immersion exposure process for each of the plurality of shot regions on the substrate P, the control apparatus CONT stops the supply of the liquid onto the substrate P by the liquid supply mechanism 10. Meanwhile, even after the liquid supply operation by the liquid supply mechanism 10 has been stopped, the control apparatus CONT continues to activate the liquid recovery mechanism 20 for just a prescribed time period. Thereby, the liquid LQ on the substrate P is sufficiently recovered. Furthermore, after the elapse of the abovementioned predetermined time period, the control apparatus CONT stops the operation of the liquid recovery mechanism 20 and, as shown in the schematic drawing of FIG. 6A, retracts the substrate stage PST from below the projection optical system PL in the horizontal direction. Here, liftable pin members 570 are provided inside the Z stage 51 (substrate holder) of the substrate stage PST. By raising and lowering the pin members 570, they rise and fall with respect to the upper surface of the Z stage 51. After the substrate stage PST is retracted from below the projection optical system PL, the control apparatus CONT raises the pin members 570 in order to raise the substrate P above the Z stage 51. Furthermore, the control apparatus CONT advances the second arm member H2 to the lower side (rear surface side) of the substrate P, which was raised by the pin members 570. After the second arm member H2 has been disposed on the lower side of the substrate P and before supporting the rear surface of the substrate P by the second arm member H2, the control apparatus CONT operates the gas supply system 35 and blows gas through the blow holes 32 against the rear surface of the substrate P. Furthermore, the rear surface of the substrate P and the support surface 30 of the second arm member H2 are spaced apart by a prescribed distance when blowing the gas against the rear surface of the substrate P from the blow holes 32. Even if, for example, the liquid LQ has adhered to the rear surface of the substrate P, the blowing of the gas thereagainst by the gas blowing mechanism (first liquid removal apparatus) 36, which is configured to include the gas supply system 35 and the blow holes 32, makes it possible to blow off and remove that liquid LQ from the substrate P.

Figure 6A:
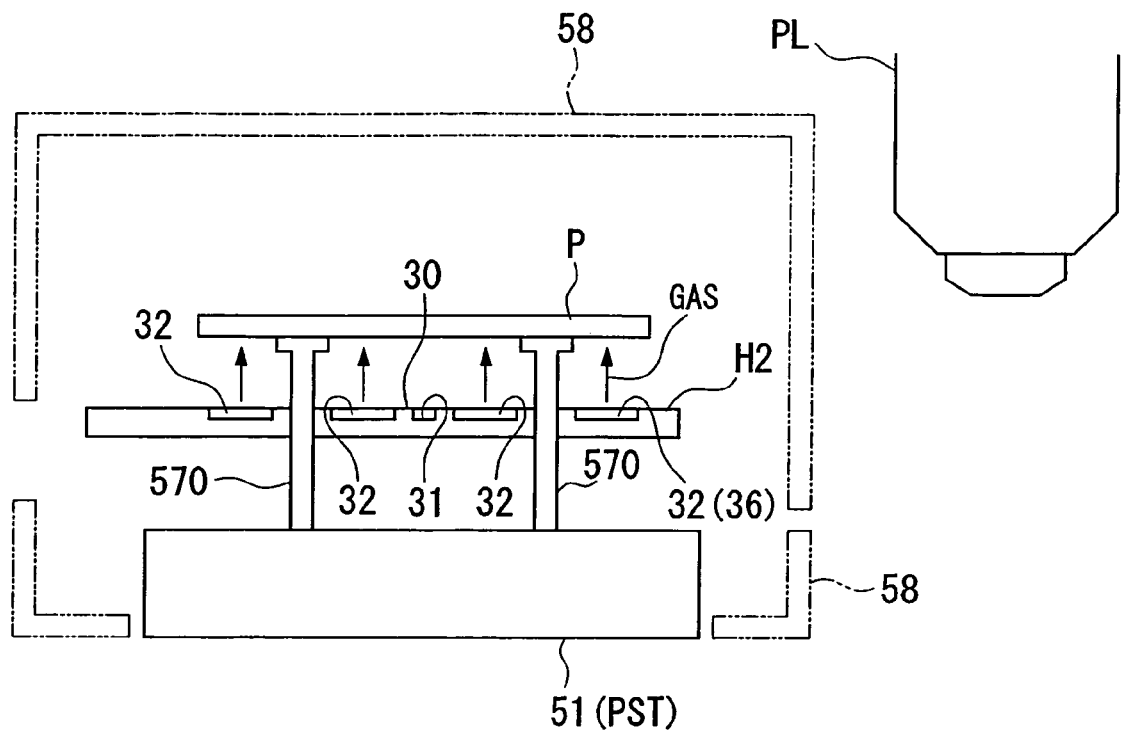
FIG. 6A is a drawing that shows one embodiment of a liquid removal operation performed by a transport arm member according to the present invention.

At this point, when the gas blowing mechanism 36 blows gas against the rear surface of the substrate P from the blow holes 32, it is preferable to dispose a cover member 58 so that it surrounds the second arm member H2 and the substrate P, as shown in FIG. 6A. In so doing, it is possible to prevent the scattering (adhesion) of the liquid LQ blown off from the rear surface of the substrate P to the surrounding equipments. In the present embodiment, the cover member 58 is constituted by a plurality of segment members, and each segment member is provided with a drive mechanism. Furthermore, the present embodiment is configured so that the segment members (cover member) each approach the substrate stage PST by means of its drive mechanism after the substrate stage PST is retracted from below the projection optical system PL.

Here, the gas blowing mechanism 36 positions the second arm member H2 in a state spaced apart from the rear surface of the substrate P by a prescribed distance, and blows gas against a portion of the area of the rear surface of the substrate P; alternatively, the gas blowing mechanism 36 can blow gas against an area, which is larger than the abovementioned the portion of the area of the rear surface of the substrate P, while the second arm member H2 moves in a state wherein it is spaced apart from the rear surface of the substrate P by a prescribed distance. Furthermore, gas may be blown against the entirety or a portion of the rear surface of the substrate P while changing the gap between the second arm member H2 and the rear surface of the substrate P. In so doing, the liquid LQ that has adhered to the rear surface of the substrate P can be removed. Of course, gas may be blown against the rear surface of the substrate P at this time while the substrate stage PST, which supports the substrate P via the pin members 570, moves without moving the second arm member H2, or the gas may be blown while the second arm member H2 and the substrate P (substrate stage PST) move relative to one another.

Furthermore, the liquid LQ should be removed from at least the portion of the area of the rear surface of the substrate P with which the support surface 30 of the second arm member H2 contacts, i.e., the support area, which is supported by the second arm member H2.

Figure 6B:
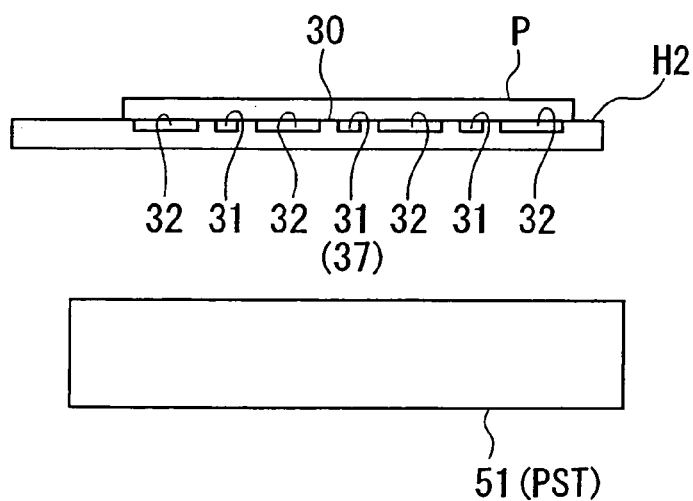
FIG. 6B is a drawing that shows one embodiment of a liquid removal operation performed by a transport arm member according to the present invention.

After the liquid LQ that has adhered to at least the area of the rear surface of the substrate P supported by the second arm member H2 has been removed, the operation of the gas supply system 35 is stopped. Subsequently, as shown in FIG. 6B, the second arm member H2 approaches the rear surface of the substrate P, and the rear surface of the substrate P and the support surface 30 of the second arm member H2 come into contact with each other. Thereafter, the control apparatus CONT activates the vacuum system 34, which constitutes the suction mechanism 37. Thereby, the rear surface of the substrate P is held by suction by the suction holes 31 provided in the support surface 30 of the second arm member H2. Because the liquid LQ that has adhered to the rear surface of the substrate P is removed before supporting the rear surface of that substrate P by the second arm member H2, the second arm member H2 can satisfactorily hold the substrate P without causing mispositioning of it. In addition, because the liquid LQ has not adhered to the rear surface of the substrate P, the liquid LQ does not infiltrate the vacuum system 34 through the suction holes 31, even when the rear surface of the substrate P is held by suction by the suction mechanism 37. Accordingly, it is possible to prevent the occurrence of problems, such as damaging the vacuum system 34.

Figure 14:
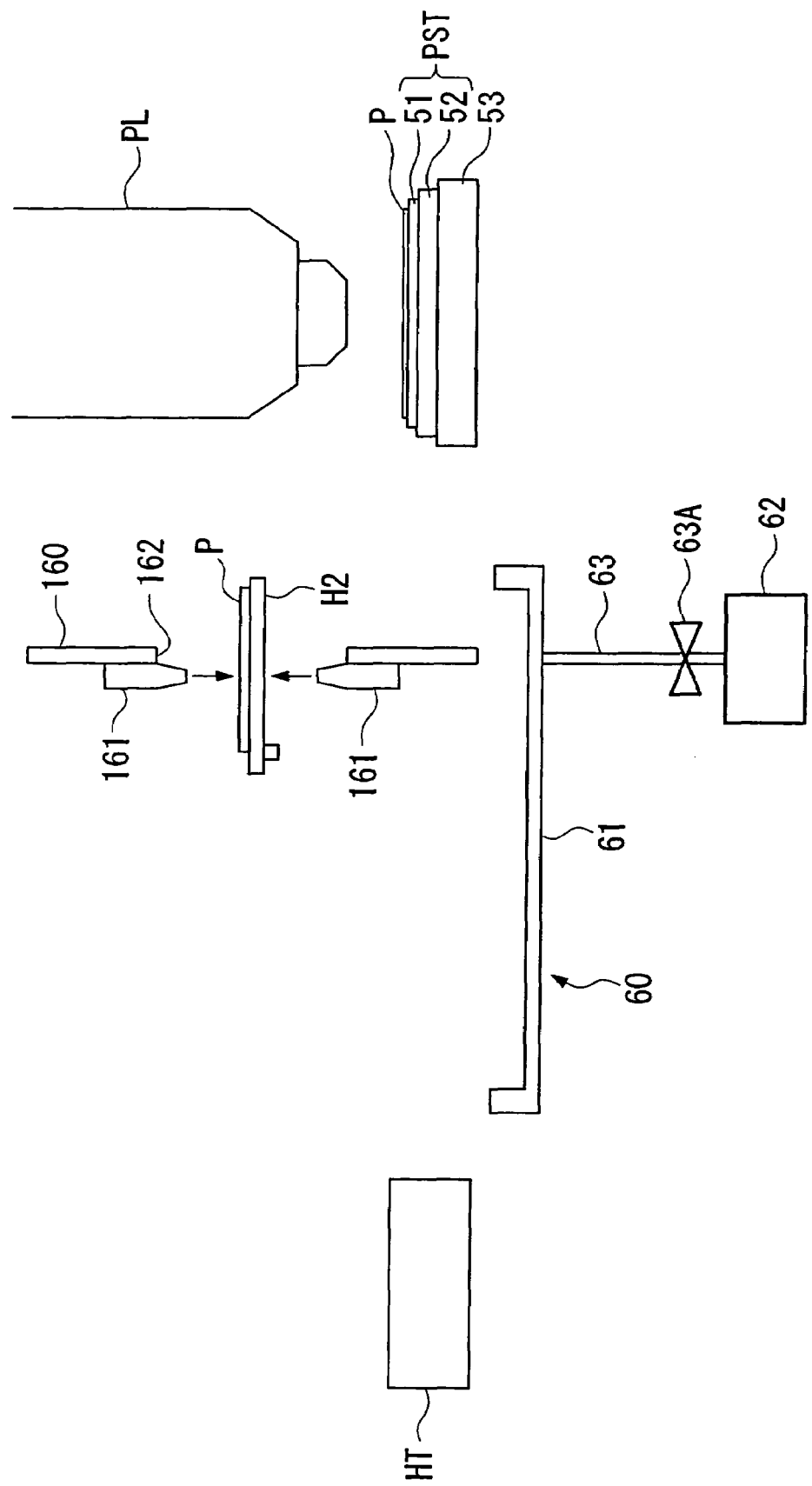
FIG. 14 is a drawing that shows another embodiment of the liquid removal operation performed by the first liquid removal system.

The second arm member H2, which holds the substrate P, transports the substrate P to the holding table HT. Here, there is a possibility that the liquid LQ has adhered to the front surface of the substrate P, to an area outside of the area of the rear surface of the substrate P supported by the second arm member H2, and the like. Incidentally, as shown in FIG. 14, a recovery mechanism 60, which recovers the liquid that dropped from the post-exposure substrate P, is disposed along the transport pathway of the substrate P between the substrate stage PST and the holding table HT, which makes it possible to prevent the scattering of the liquid LQ from the substrate P to the equipments and members in the vicinity of the transport pathway, and to prevent the adhesion of the liquid LQ to those equipments and members, even if, for example, the substrate P is transported in a state with the liquid LQ adhered thereto. Here, the recovery mechanism 60 includes a drain member 61, which is disposed below the transport pathway of the second arm member H2, and a liquid suction apparatus 62, which discharges the liquid LQ recovered by the drain member 61 therefrom, as shown in FIG. 14. The drain member 61 is provided inside the first chamber apparatus CH1, and the liquid suction apparatus 62 is provided outside of the first chamber apparatus CH1. The drain member 61 and the liquid suction apparatus 62 are connected by a pipeline 63, and the pipeline 63 is provided with a valve 63A that opens and closes the passageway of this pipeline 63.

Although the liquid LQ may drops from the post-exposure substrate P while the second arm member H2 is transporting the substrate P, to which the liquid LQ has adhered, that dropped liquid LQ can be recovered by the drain member 61. The recovery of the dropped liquid LQ by the drain member 61 makes it possible to prevent problems, such as the scattering of the liquid LQ to the surroundings of the transport pathway. Furthermore, by sucking the liquid LQ on the drain member 61 provided inside the chamber apparatus CH1, the liquid suction apparatus 62 can discharge the liquid LQ outside of the chamber apparatus CH1 so that the liquid LQ does not pool in the drain member 61 inside the chamber apparatus CH1, which makes it possible to prevent the problem of humidity fluctuations (environmental fluctuations), inside the chamber apparatus CH1. Here, the liquid suction apparatus 62 can continuously perform the operation of sucking the liquid LQ recovered in the drain member 61, or can intermittently perform such operation only at preset prescribed intervals. By performing the suction operation continuously, the liquid LQ does not pool in the drain member 61, which makes it possible to remarkably improve the prevention of humidity fluctuations inside the chamber apparatus CH1. Meanwhile, without performing the suction operation (discharge operation) by the liquid suction apparatus 62 during the exposure of the substrate P in the exposure apparatus main body EX, by performing the suction operation only during, for example, the time period in which the exposure is not performed, it is possible to prevent the problem wherein vibrations generated by the suction operation adversely affect the exposure accuracy.

Figure 7A:
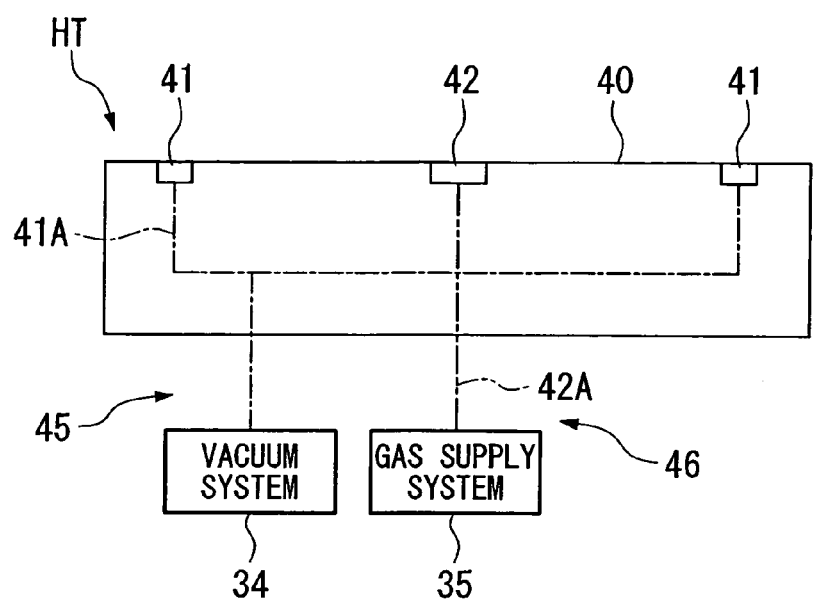
FIG. 7A is a schematic block diagram that shows one embodiment of a holding table according to the present invention.
Figure 7B:
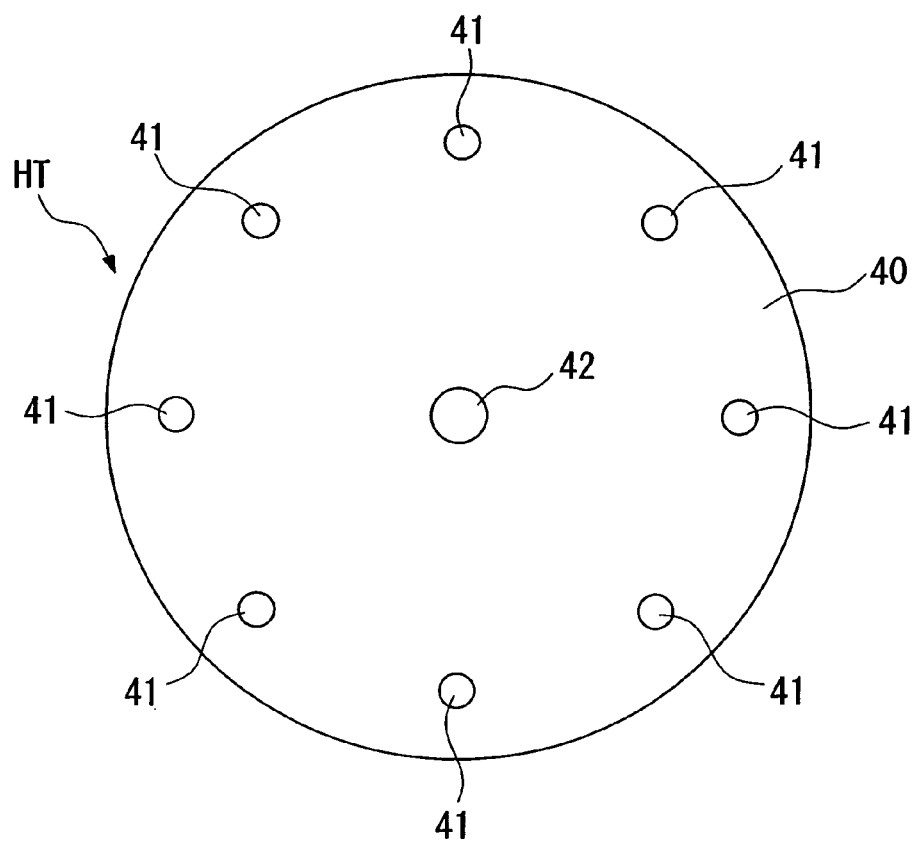
FIG. 7B is a schematic block diagram that shows one embodiment of the holding table according to the present invention.

FIGS. 7A and B show the holding table HT, which temporarily holds the substrate P that was transported by the second arm member H2, wherein FIG. 7A is a side view and FIG. 7B is a plan view. In FIG. 7, the holding table HT, which constitutes a substrate support member, is substantially circularly shaped in a plan view, and a blow hole 42, which is an opening part, is provided at substantially the center part of the upper surface (support surface) 40 thereof. Although the present embodiment is configured so that one blow hole 42 is provided, it is also possible to provide a blow hole 42 at each of a plurality of arbitrary positions in the support surface 40. Furthermore, the support surface 40 is provided with a plurality of suction holes 41 at prescribed intervals so that they surround the blow hole 42. Furthermore, the vacuum system 34 is connected to the suction holes 41 via a passageway 41A, which is formed inside the holding table HT. The vacuum system 34 and the suction holes 41 constitute a suction mechanism 45. In addition, the gas supply system 35 is connected to the blow hole 42 by a passageway 42A, which is formed inside the holding table HT. The gas supply system 35 and the blow hole 42 constitute a gas blowing mechanism 46. The passageway 42A is provided with a filter, which removes foreign matter (waste, oil mist, and the like) in the gas that is blown against the substrate P.

Figure 8A:
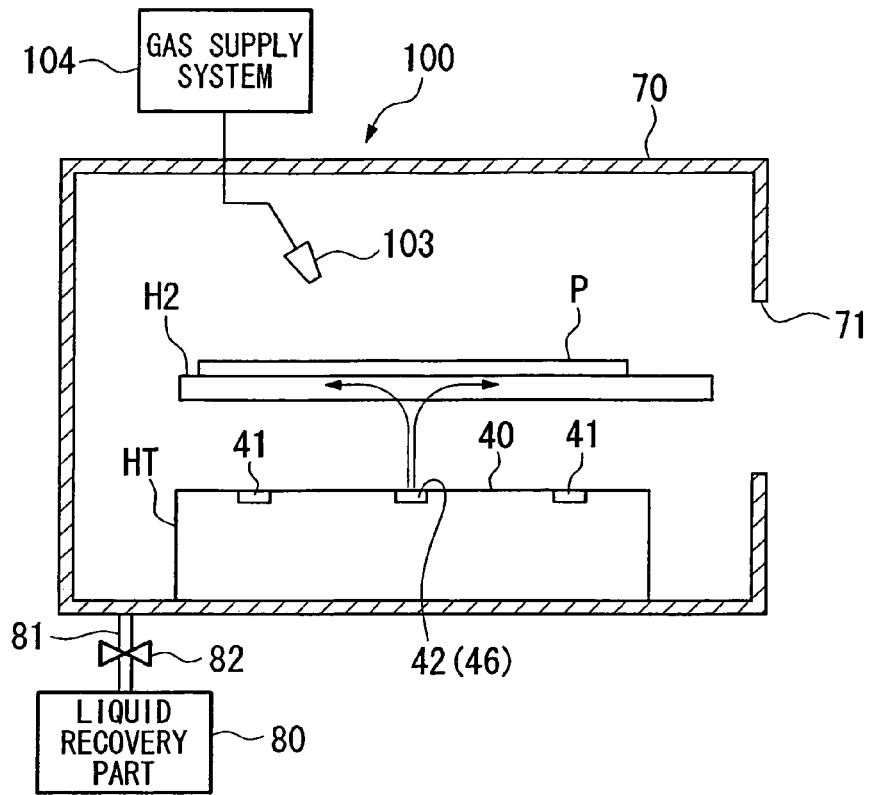
FIG. 8A is a drawing that shows one embodiment of the liquid removal operation performed by the holding table according to the present invention.

FIGS. 8A and B show the first liquid removal system 100. The first liquid removal system 100 principally removes the liquid LQ that has adhered to at least one of the front surface and the rear surface of the substrate P. These drawings show the operation wherein the second arm member H2 transports the substrate P to the holding table HT. In FIG. 8A, the second arm member H2, which holds the substrate P, enters through the opening part 71 to the interior of the cover member 70, which houses the holding table HT. At this time, the control apparatus CONT drives the shutter part 71A to open the opening part 71. Meanwhile, the opening part 72 is closed by the shutter part 72A. After the substrate P, of which a prescribed area is supported by the second arm member H2, is disposed above the holding table HT, the control apparatus CONT activates the gas supply system 35, which constitutes the gas blowing mechanism 46, and blows gas against the rear surface of the substrate P from the blow holes 42. Here, as discussed above, the liquid LQ on the portion of the area (first support area) of the rear surface of the substrate P that is supported by the second arm member H2, has already been removed by the gas that was blown thereagainst from the blow holes 32, which are provided to the second arm member H2, but there is a possibility that the liquid LQ has adhered to the area of the rear surface of the substrate P at which the second arm member H2 does not support. Therefore, before the holding table HT, which constitutes a part of the first liquid removal system 100, supports the rear surface of the substrate P, the control apparatus CONT blows off and removes the liquid LQ that has adhered to the area (second support area), which is to be supported by the holding table HT, of the rear surface of the substrate P by blowing gas against the rear surface of the substrate P from the blow hole 42. Namely, the blow hole 42 and the gas supply system 35 connected thereto constitute a third liquid removal apparatus that removes the liquid LQ that has adhered to the area (second support area), which is to be held by the holding table HT (second liquid removal apparatus), of the rear surface of the substrate P.

When removing the liquid LQ that has adhered to the rear surface of the substrate P, gas is blown thereagainst from the blow hole 42 in a state wherein the rear surface of the substrate P, which is held by the second arm member H2, and the support surface 40 of the holding table HT are spaced apart by a predetermined spacing. By blowing the gas, the liquid LQ that has adhered to the rear surface of the substrate P is blown off and removed. The removed liquid LQ does not scatter from the cover member 70 to the surroundings. Furthermore, the present embodiment is constituted so that the holding table HT, which includes the blow hole 42 and the second arm member H2 that holds the substrate P, do not move when blowing gas against the rear surface of the substrate P; however, because the gas that is blown out from the blow hole 42 is blown against the substantially center part of the rear surface of the substrate P, and then flows toward the edge part of the substrate P, the liquid LQ that has adhered to the rear surface of the substrate P in the vicinity of the edge part can be satisfactorily removed. Of course, it is also possible to blow the gas against the rear surface of the substrate P while moving the substrate P relative to the blow hole 42. For example, the gas may be blown against the rear surface of the substrate P while moving the second arm member H2, which holds the substrate P, in the X axial direction (Y axial direction) and moving the holding table HT, which has the blow hole 42, in the Y axial direction (X axial direction). Alternatively, the substrate P and the blow hole 42 may be moved rotationally relative to one another. Furthermore, the gas may be blown against the rear surface of the substrate P in a state wherein the second arm member H2 is operated to incline that substrate P. In so doing, the liquid LQ that has adhered to the rear surface of the substrate P collects in one place due to its own weight (effect of gravity), making it easy to drop (be removed) from the substrate P. Furthermore, if the liquid LQ has adhered to the second arm member H2, then that liquid LQ can be removed together with the liquid LQ that has adhered to the substrate P.

A liquid recovery part 80 is connected to the cover member 70 by a recovery pipe 81. The recovery pipe 81 is provided with a valve 82, which opens and closes the passageway of that recovery pipe 81. The liquid LQ that is blown off from the substrate P is recovered by the liquid recovery part 80, which is connected to the cover member 70. By sucking the gas inside the cover member 70 together with the scattered liquid LQ, the liquid recovery part 80 recovers the liquid LQ scattered from the substrate P. Here, the liquid recovery part 80 continuously performs the operation of sucking the gas inside the cover member 70 and the scattered liquid LQ. Thereby, the liquid LQ does not pool inside the cover member 70, e.g., on the inner wall or at the bottom thereof, and the humidity inside the cover member 70 therefore does not fluctuate greatly. In addition, the humidified gas inside the cover member 70 does not flow out of it, even when the shutter parts 71A and 72A are opened.

Figure 8B:
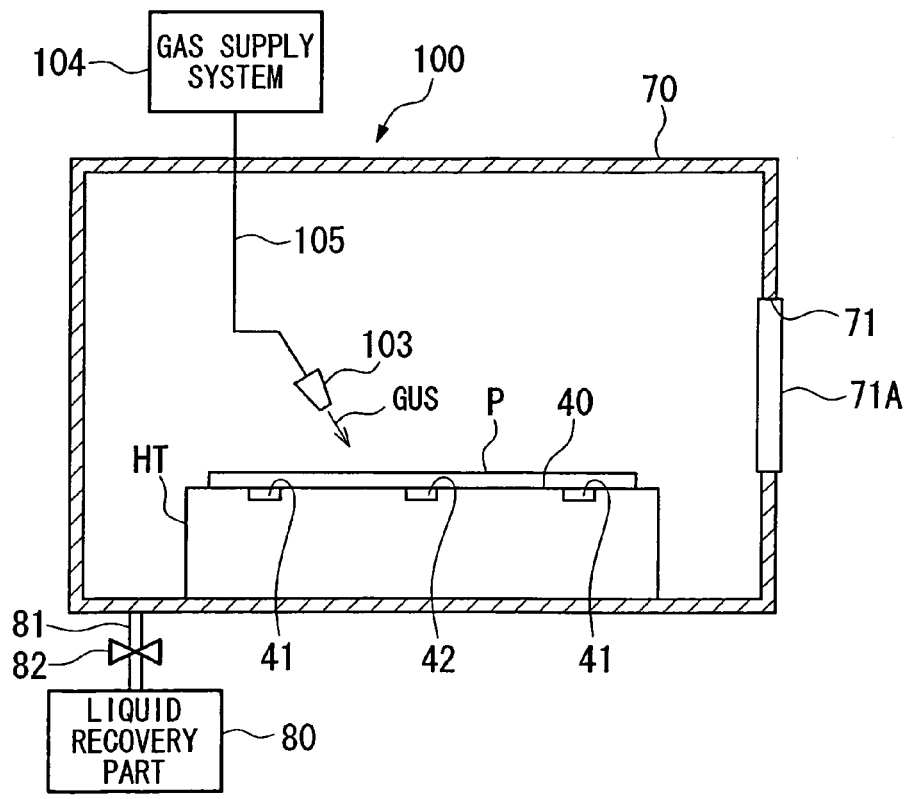
FIG. 8B is a drawing that shows one embodiment of the liquid removal operation performed by the holding table according to the present invention.

After the liquid LQ on the rear surface of the substrate P has been removed, pin members (not shown) rise from the holding table HT and support the rear surface of the substrate P. Furthermore, the pin members provided to the holding table HT have the same constitution as the pin members 570 that were explained referencing FIG. 6A. Furthermore, after the substrate P is supported by the pin member, the second arm member H2 withdraws to the outside of the cover member 70, and the opening part 71 is closed by the shutter part 71A. Furthermore, by the lowering of the pin members, which support the substrate P, the substrate P is supported by the support surface 40 of the holding table HT, as shown in FIG. 8B. After the substrate P is supported by the support surface 40, the control apparatus CONT activates the vacuum system 34 and holds the substrate P by suction through the suction holes 41.

In addition, a blow nozzle 103, which constitutes one part of the first liquid removal system 100, is disposed inside the cover member 70, and a gas supply system 104 is connected to the blow nozzle 103 via a passageway 105. The passageway 105 is provided with a filter that removes foreign matter (waste, oil mist, and the like) in the gas that is blown against the substrate P. Furthermore, by activating the gas supply system 104, a prescribed gas is blown against the front surface of the substrate P from the blow nozzle 103 through the passageway 105, and the liquid LQ that adhered to the front surface of the substrate P is blown off and removed by that gas.

Figure 9:
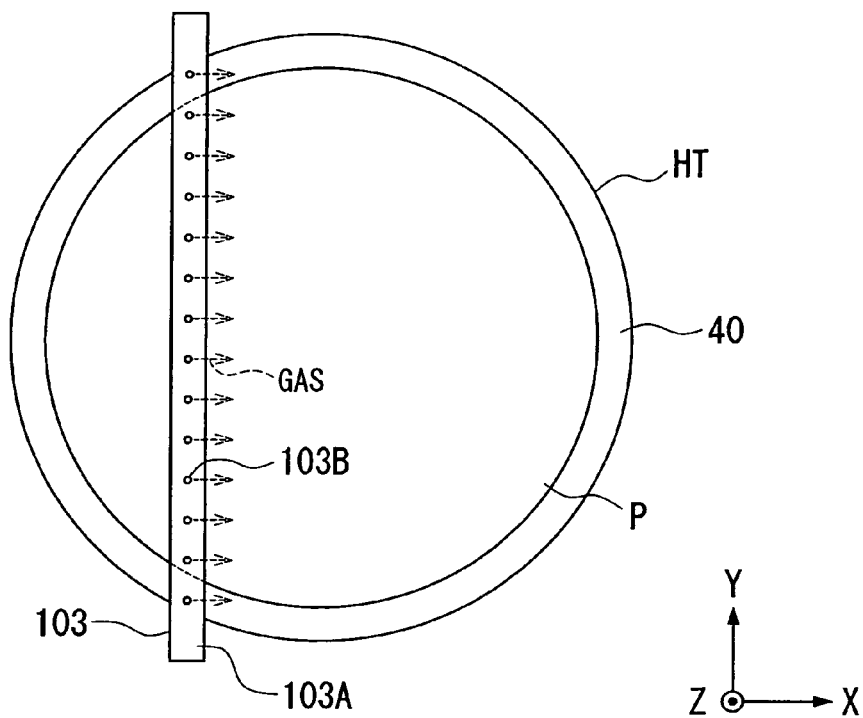
FIG. 9 is a drawing that shows one embodiment of the liquid removal operation performed by a first liquid removal system.

FIG. 9 is a drawing of the interior of the cover member 70 of FIG. 8B, viewed from above. The rear surface of the substrate P is supported by the support surface 40 of the holding table HT. The blow nozzle 103 includes a nozzle main body part 103A, of which the longitudinal direction is in the Y axial direction, and a plurality of nozzle holes 103B, which are provided so that they are lined up in the longitudinal direction of the nozzle main body part 103A. The gas supplied from the gas supply system 104 is blown out from each of the plurality of nozzle holes 103B. The substrate P, which is held by the holding table HT, and the blow nozzle 103 are provided so that they are capable of moving relative to one another. The present embodiment is constituted so that the blow nozzle 103 can perform a scanning motion in the X axial direction relative to the substrate P, which is held by the holding table HT. Furthermore, the holding table HT, which holds the substrate P, may move with respect to the blow nozzle 103, or both the holding table HT and the blow nozzle 103 may be moved. Furthermore, the liquid LQ that was blown off from the front surface of the substrate P is recovered by the liquid recovery part 80.

The substrate P from which the liquid LQ on the front surface and the rear surface has been removed, respectively, is transported by the fourth arm member H4 to the developer apparatus D. When the fourth arm member H4 transports the substrate P from the holding table HT, the control apparatus CONT drives the shutter part 72A to open the opening part 72, and the fourth arm member H4 enters from the opening part 72 into the interior of the cover member 70. In parallel thereto, the pin members of the holding table HT raise the substrate P, and the fourth arm member H4 holds the rear surface of the raised substrate P. Furthermore, the holding table HT rotates before passing the substrate P to the fourth arm member H4, and changes the substrate P to the desired orientation. Furthermore, the fourth arm member H4, which holds the substrate P, unloads that substrate P from the interior of the cover member 70 through the opening part 72.

As explained above, before the second arm member H2 (or the holding table HT) supports the rear surface of the substrate P, gas is blown through the blow holes 32 (42), which constitute a liquid removal mechanism provided to the second arm member H2 (holding table HT) that removes the liquid LQ on the rear surface that is the surface of the substrate P to be supported, and it is therefore possible to prevent the problem wherein the residual liquid LQ forms a lubricating film that causes the mispositioning of the substrate P with respect to the second arm member H2 (holding table HT), and to support the substrate P in the desired state. In addition, even if the present embodiment is constituted so that the second arm member H2 (or the holding table HT) holds the substrate P by vacuum suction through the suction holes 31 (41), removing the liquid LQ on the rear surface of the substrate P makes it possible to prevent the problem wherein the liquid LQ infiltrates the vacuum system 34.

In addition, by removing the liquid LQ that has adhered to at least the support area, which is supported by the second arm member H2, of the rear surface of the substrate P, the second arm member H2 can transport the substrate P in a state wherein such is satisfactorily held. Furthermore, by subsequently removing the liquid LQ that adhered to the rear surface and the front surface of the substrate P using the first liquid removal system 100, the occurrence of problems, such as the liquid LQ from that substrate P dropping and scattering in the subsequent transport pathway of the substrate P are prevented. Furthermore, by sufficiently removing the liquid LQ on both the front surface and the rear surface of the substrate P, the prescribed processes after the immersion exposure process, such as the development process, can be smoothly performed without being adversely affected by residual liquid LQ.

In the present embodiment, the liquid LQ that has adhered to the substrate P is removed by blowing gas thereagainst. Here, the gas that is blown is preferably a dried gas, such as dry air. In so doing, the liquid LQ that has adhered to the substrate P dries, which promotes removal. In addition to a gas of a temperature substantially the same as that inside the chamber apparatus CH1, the blown gas may be warm air that has a temperature higher than the interior of the chamber apparatus CH1. In addition, gases such as dry air, nitrogen gas, and helium gas can be used as the blown gas.

Furthermore, in the present embodiment, before the second arm member H2 supports the rear surface of the substrate P, the liquid LQ is removed using the blow holes 32, which constitute one part of the liquid removal mechanism provided to the second arm member H2; however, the liquid LQ may be removed by blowing gas against the rear surface of the substrate P from a blow hole provided to a member separate from the second arm member H2, after which the second arm member H2 may then support the rear surface of the substrate P. Likewise, even before the holding table HT holds the substrate P, instead of removing the liquid LQ on the rear surface of the substrate P using the blow hole 42 provided to the holding table HT, the liquid LQ may be removed by blowing gas against the rear surface of the substrate P from a blow hole provided to a separate member.

Figure 10:
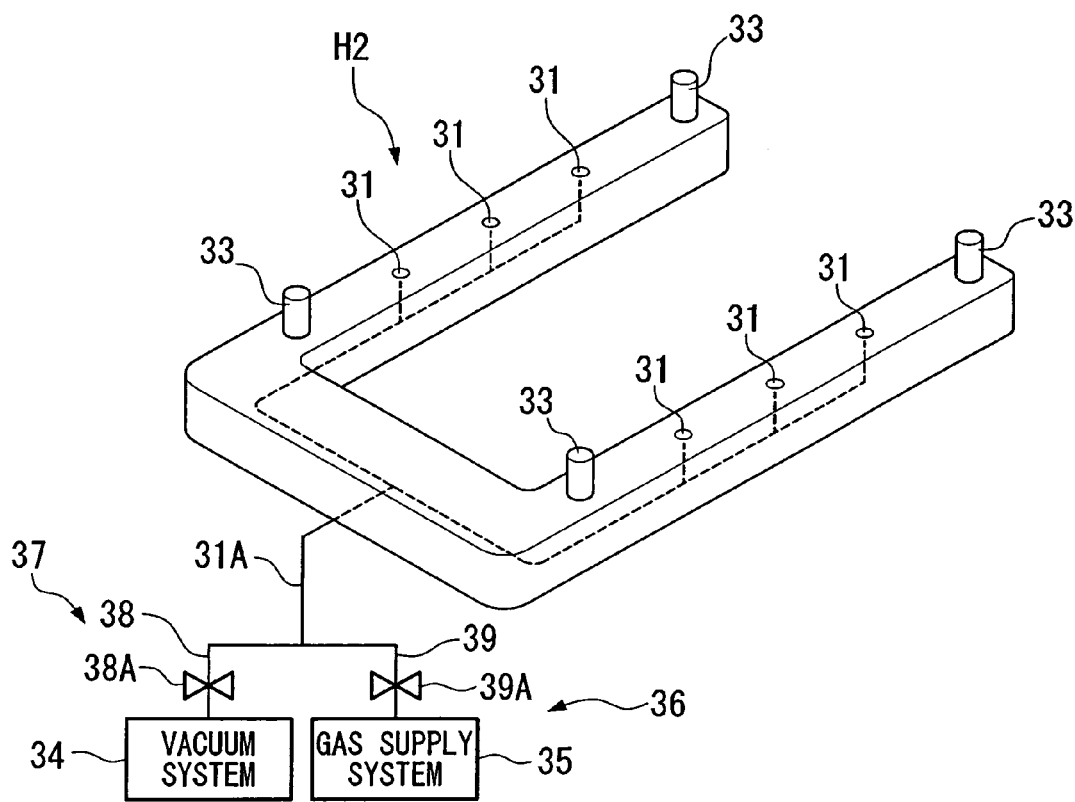
FIG. 10 is a schematic block diagram that shows another embodiment of a transport arm member according to the present invention.

The following explains another embodiment of the present invention, referencing FIG. 10. In the explanation below, constituent elements that are identical or equivalent to the embodiment discussed above are assigned the same symbol, and the explanation thereof is simplified or omitted.

The abovementioned embodiments are constituted so that the suction holes 31 and the blow holes 32 are provided to the support surface 30 of the second arm member H2 at mutually differing positions, but the feature of the present embodiment is that the opening parts provided to the support surface 30 function both as suction holes and blow holes.

In FIG. 10, the opening parts 31 are provided to the support surface 30 of the second arm member H2. Furthermore, one end part of the passageway 31A is connected to the opening parts 31, and the other end part of the passageway 31A branches to a first passageway 38 and a second passageway 39; furthermore, the first passageway 38 is connected to the vacuum system 34, and the second passageway 39 is connected to the gas supply system 35. A valve 38A that opens and closes the first passageway 38 is provided thereon, and a valve 39A that opens and closes the second passageway 39 is provided thereon. The control apparatus CONT controls the operation of the valves 38A and 39A.

Before the second arm member H2 shown in FIG. 10 holds the rear surface of the substrate P for which the immersion exposure process has completed, the control apparatus CONT drives the valves 38A and 39A to open the second passageway 39 as well as close the first passageway 38, and activates the gas supply system 35. Thereby, the gas is blown against the rear surface of the substrate P through the opening parts (blow holes) 31, and it is therefore possible to remove the liquid LQ that has adhered to the rear surface of the substrate P. Furthermore, after the completion of the removal of the liquid LQ that has adhered to the rear surface of the substrate P, the control apparatus CONT drives the valves 38A and 39A to open the first passageway 38 and close the second passageway 39, stops the operation of the gas supply system 35, and activates the vacuum system 34. In so doing, the second arm member H2 can hold the substrate P by suction through the opening parts (suction holes) 31. Thus, it is also possible to remove the liquid LQ that has adhered to the substrate P, and to hold such by suction by selectively connecting the gas supply system 35 and the vacuum system 34 to the opening parts 31 using the first and second passageways 38, 39 and the valves 38A and 39A to selectively connect. In addition, not only can the liquid be removed by blowing the gas, but the liquid on the rear surface of the substrate P may also be sucked, or both may be performed in parallel.

Figure 11:
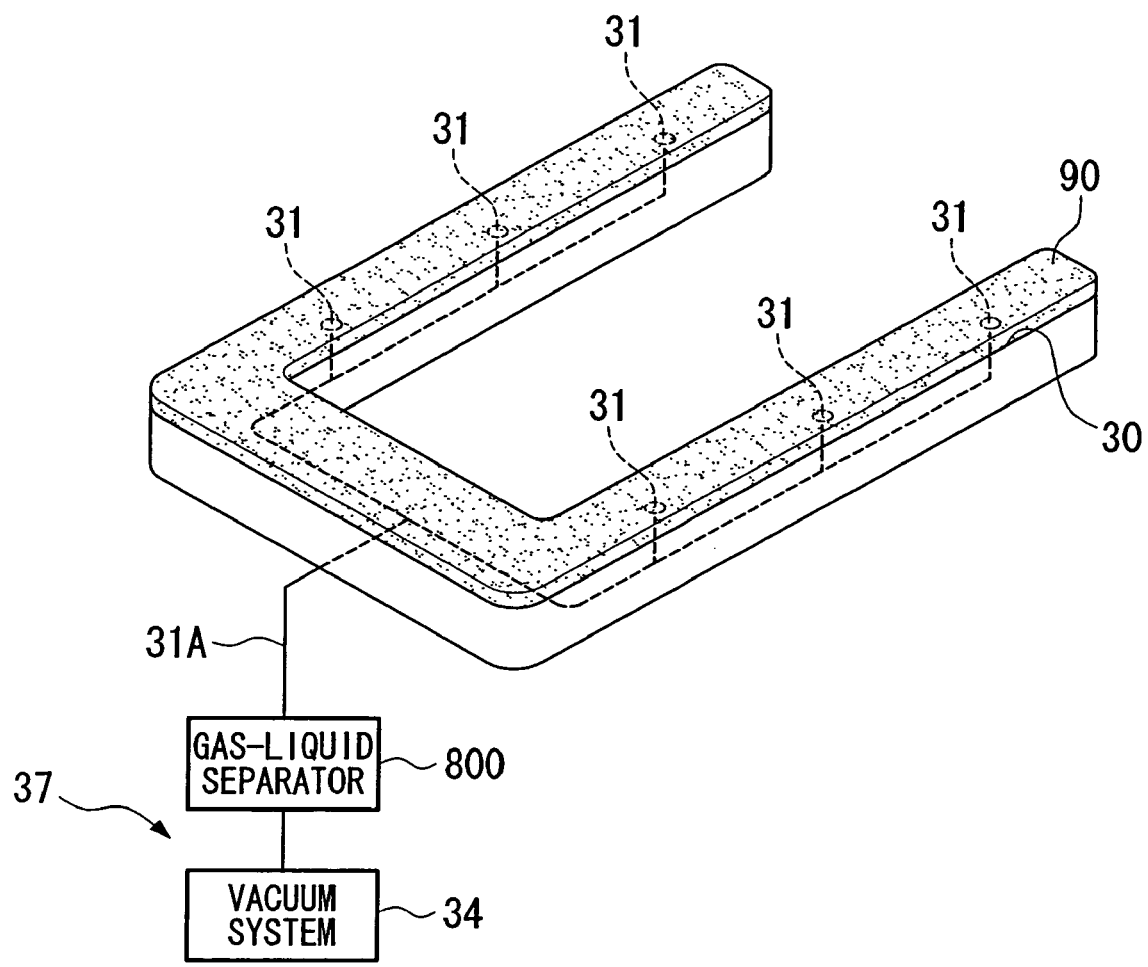
FIG. 11 is a schematic block diagram that shows another embodiment of a transport arm member according to the present invention.

FIG. 11 shows an example wherein a moisture absorbing material 90 is provided to the upper surface 30 of the second arm member H2. In FIG. 11, the moisture absorbing material 90, which absorbs the liquid LQ, is provided to the upper surface 30 of the second arm member H2. A sponge member, porous ceramics, or the like can be used as the moisture absorbing material 90.

When the second arm member H2 shown in FIG. 11 supports the rear surface of the substrate P, the moisture absorbing material 90 provided to the second arm member H2 is brought into contact with the rear surface of the substrate P before the rear surface of the substrate P is supported. In so doing, the liquid LQ that has adhered to the rear surface of the substrate P is absorbed by the moisture absorbing material 90 and removed from the rear surface of the substrate P. Furthermore, when using the moisture absorbing material 90 to remove the liquid LQ that has adhered to the rear surface of the substrate P, the moisture absorbing material 90 may be brought to a position close to the substrate P so that the moisture absorbing material 90 and the substrate P are spaced apart by just a prescribed distance, and the liquid LQ that has adhered to the rear surface of the substrate P may be absorbed (removed) using the capillary phenomenon.

After the liquid LQ that has adhered to the rear surface of the substrate P has been removed using the moisture absorbing material 90, the control apparatus CONT brings the second arm member H2 (moisture absorbing material 90) into contact with the rear surface of the substrate P, and activates the vacuum system 34, which is connected to the suction holes 31 via the passageway 31A. The suction holes 31 hold the rear surface of the substrate P by suction through the moisture absorbing material 90. In so doing, a lubricating film of the liquid LQ is not formed between the substrate P and the second arm member H2 (moisture absorbing material 90), and it is therefore possible to prevent the occurrence of the problem wherein the substrate P is mispositioned with respect to the second arm member H2. Here, it is preferable to provide the gas-liquid separator 800 between the vacuum system 34 and the suction holes 31 of the passageway 31A. Because the moisture absorbing material 90 contains the liquid LQ, there is a risk that the operation of the vacuum system 34 will cause the liquid LQ contained in the moisture absorbing material 90 to infiltrate the vacuum system 34. However, by separating the liquid component sucked by the suction holes 31 using the gas-liquid separator 800 so that only the gas component flows into the vacuum system 34, it is possible to prevent the occurrence of problems, such as damage to the vacuum system 34.

Furthermore, although the moisture absorbing material 90 is provided herein to the upper surface 30 of the second arm member H2, it is also acceptable to support the moisture absorbing material 90 by a separate support member without providing the moisture absorbing material 90 to the second arm member H2. In this case, before the second arm member H2 supports the rear surface of the substrate P, the liquid LQ that has adhered to the rear surface of the substrate P is absorbed (removed) by the moisture absorbing material 90, which is supported by the abovementioned support member, and the rear surface of the substrate P is then supported by the second arm member H2. In addition, when using the moisture absorbing material 90 to remove the liquid LQ that has adhered to the rear surface of the substrate P, the absorption may be executed by pressing the moisture absorbing material 90 against the rear surface of the substrate P, or the absorption may also be executed while moving the substrate P and the moisture absorbing material 90 relative to one another. In addition, in this case as well, the absorption can be executed using the capillary phenomenon in a state wherein the moisture absorbing material 90 and the rear surface of the substrate P are slightly spaced apart without making contact. In so doing, the rear surface of the substrate P does not get damaged. In addition, it is also possible to provide the moisture absorbing material 90 to the upper surface 40 of the holding table HT.

In the abovementioned embodiment, the first liquid removal system 100, which removes the liquid LQ that has adhered to the front surface of the substrate P, removes the liquid LQ by blowing gas from the blow nozzle 103 against the front surface of the substrate P, but it is also possible to fling off and remove the liquid LQ that has adhered to the front surface of the substrate P by rotating the substrate P.

Figure 12A:
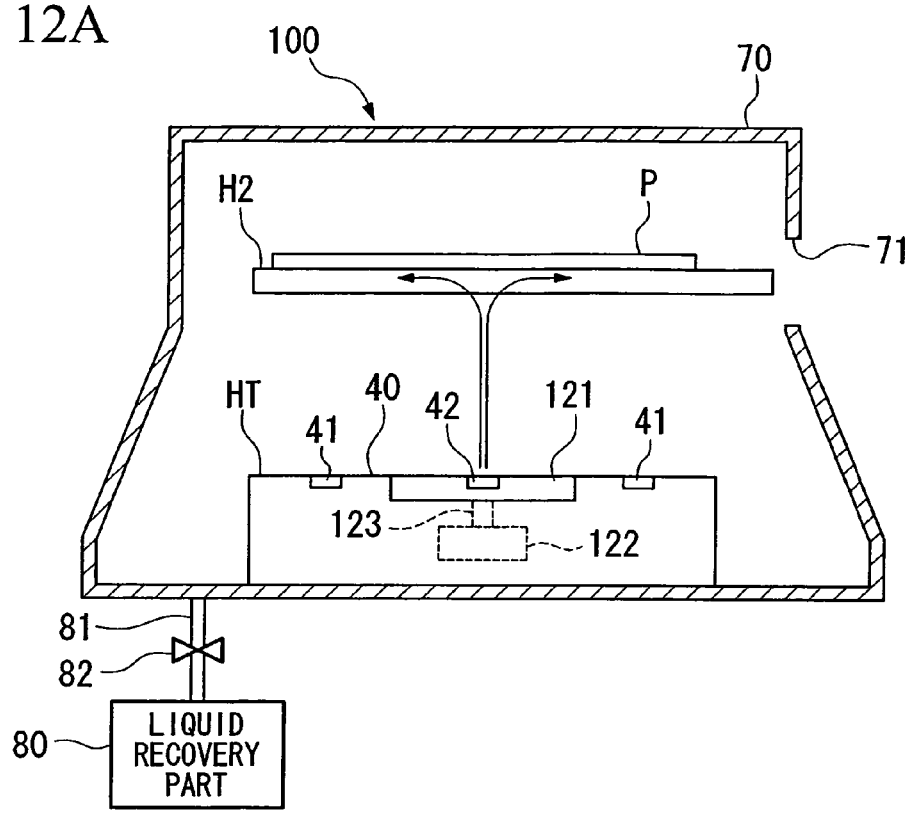
FIG. 12A depicts another embodiment of the liquid removal operation performed by the first liquid removal system.
Figure 12B:
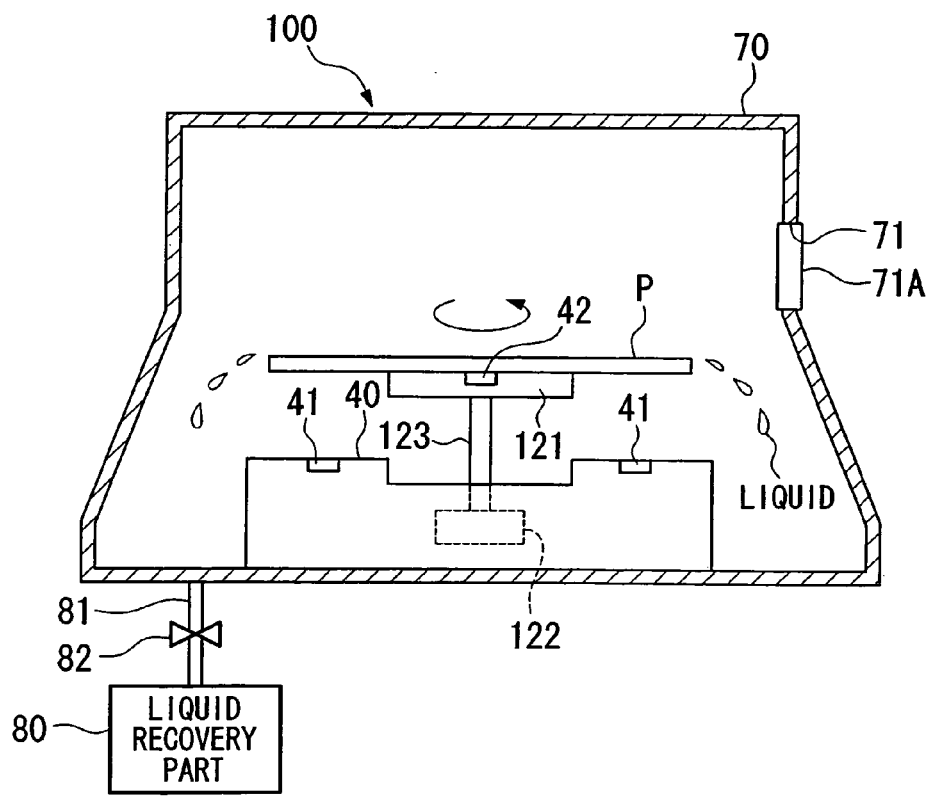
FIG. 12B is a drawing that shows another embodiment of the liquid removal operation performed by the first liquid removal system.

FIG. 12A-B show the first liquid removal system 100, which includes a rotary mechanism that flings off the liquid LQ, which has adhered to the front surface of the substrate P, by rotating the substrate P. In FIG. 12A-B, the holding table HT of the first liquid removal system 100 includes a holder part 121, which holds the center part of the rear surface of the substrate P, and a rotary mechanism 122, which rotates the holder part 121 that holds the substrate P. A suction hole is provided in the upper surface of the holder part 121, which holds the center part of the rear surface of the substrate P by suction. The rotary mechanism 122 is constituted by a motor, which is provided inside the holding table HT, and rotates the holder part 121 by rotating a shaft part 123, which is connected to the holder part 121. The shaft part 123 is expandably and contractably provided, and the holder part 121, along with the shaft part 123, is provided liftable with respect to the upper surface 40 of the holding table HT. When the holder part 121, which holds the substrate P, rises with respect to the upper surface 40 of the holding table HT, the substrate P becomes spaced apart from the holding table HT, and can be rotated by driving the rotary mechanism 122. Meanwhile, when the holder part 121 is lowered, the substrate P is held on the upper surface 40 of the holding table HT by the suction from the suction holes 41.

As shown in FIG. 12A, before the rear surface of the substrate P is supported by the holding table HT, gas is blown against the rear surface of the substrate P from the blow hole 42 formed at the center part of the holder part 121, which functions as the substrate support member of the holding table HT. Thereby, the liquid LQ that has adhered to the rear surface of the substrate P is removed. Subsequently, the holder part 121 rises while holding the substrate P by suction and rotates such, as shown in FIG. 12B. Thereby, the liquid LQ that has adhered to the front surface of the substrate P is flung off and removed.

Incidentally, the lower part of the cover member 70 shown in FIG. 12A-B is inclined so that it gradually widens downwardly. Thereby, even if the liquid LQ that flung off from the substrate P hits the inner wall of the cover member 70, the cover member 70 is shaped so that it gradually widens downwardly, which makes it possible to prevent the problem wherein the liquid LQ that hits the inner wall bounces back and once again adheres to the substrate P. Furthermore, as mechanisms to prevent the bounce back of the liquid LQ, it is also possible, in addition to inclining the inner wall of the cover member 70, to prevent the problem wherein the liquid LQ that hits the inner wall of the cover member 70 bounces back to the substrate P side by, for example, attaching a moisture absorbing material to the inner wall of the cover member 70, making the inner wall jagged shaped (waveform shape), or providing a suction port that is connected to a liquid suction apparatus.

Figure 13:
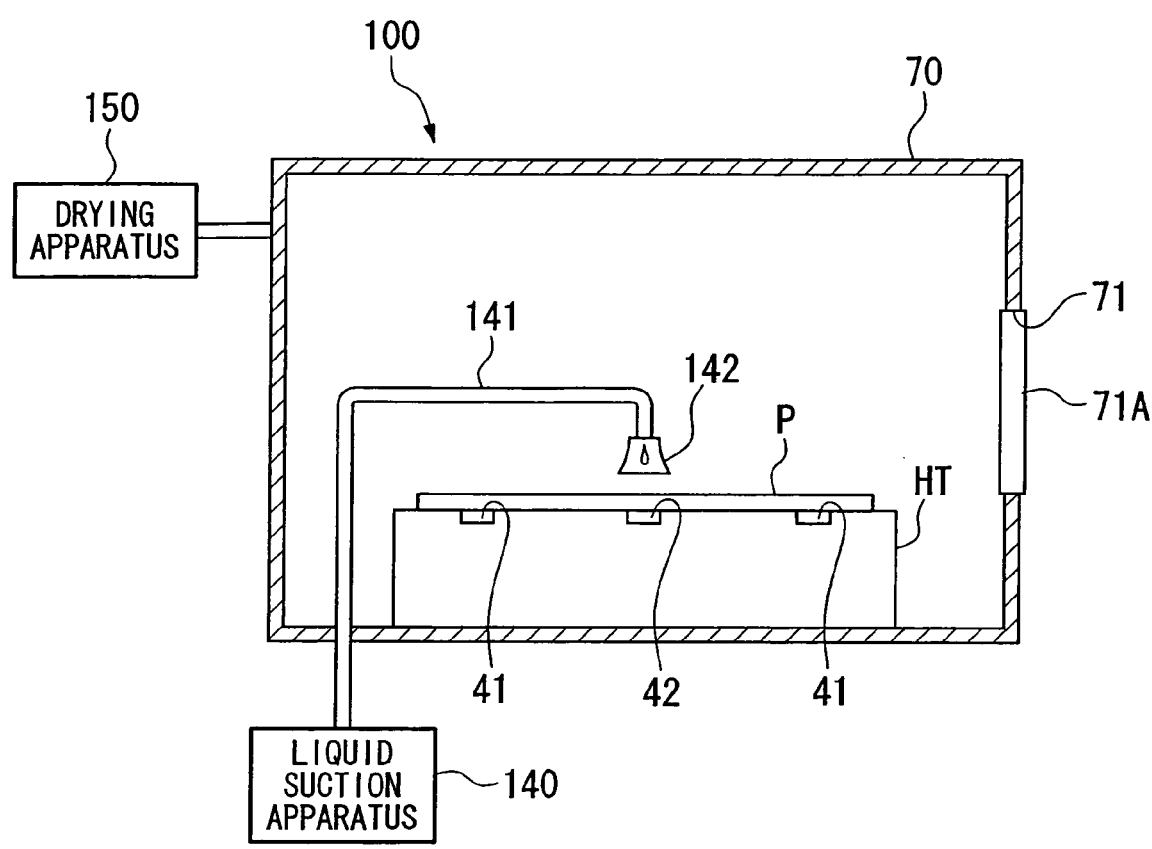
FIG. 13 is a drawing that shows another embodiment of the liquid removal operation performed by the first liquid removal system.

As shown in FIG. 13, it is also possible to remove the liquid LQ that has adhered to the front surface of the substrate P by using a liquid suction apparatus 140 to suck and recover the liquid LQ. In FIG. 13, a recovery nozzle 142 is connected to the liquid suction apparatus 140 via a recovery pipe 141. The recovery nozzle 142 is disposed close to the front surface of the substrate P, which is held by the holding table HT. The liquid suction apparatus 140 configured to include, for example, a vacuum system, and is provided with a gas-liquid separator (not shown), which separates the liquid and the gas recovered by the recovery nozzle 142, along the recovery pipe 141. When removing the liquid LQ that has adhered to the front surface of the substrate P, the recovery nozzle 142 approaches the front surface of the substrate P, and the liquid LQ on the front surface of the substrate P is collected, by activating the liquid suction apparatus 140, through the recovery nozzle 142 and the recovery pipe 141 into a recovery tank, or the like, which is provided to the liquid suction apparatus 140. In addition, even when removing the liquid LQ on the front surface of the substrate P through the recovery nozzle 142, the liquid LQ can be removed while moving the recovery nozzle 142 and the substrate P relative to one another.

Furthermore, the shape and arrangement of the recovery nozzles (25) as explained referencing FIG. 4, for example, may be adapted to the recovery nozzle 142. Alternatively, a recovery member that has an annular recovery port may be adopted as the recovery nozzle.

In addition, the liquid LQ that has adhered to the front surface of the substrate P may be dried by a drying apparatus 150 that supplies dry air or warm gas to the interior of the cover member 70 that houses the substrate P.

In the abovementioned embodiment, the liquid is removed, by blowing gas against the rear surface of the substrate P with the gas blowing mechanism provided to the second arm member H2, from the portion of the area, which is supported by the second arm member H2, of the rear surface of the substrate P, but the liquid on the rear surface outside of that portion and on the front surface of the substrate P may be removed by the following constitution. Namely, as shown in FIG. 14, a wall member 160 is provided on the transport pathway of the second arm member H2, and a gas blow nozzle 161 is attached to each of the upper and lower sides of the wall member 160. Furthermore, when the substrate P passes through an opening part 162, it is possible to remove the liquid LQ that has adhered to the substrate P by the gas blow nozzles 161 blowing gas against the front surface and the rear surface of the substrate P, respectively. Furthermore, gas can be blown over the entire area of the substrate P by the gas blow nozzles 161 blowing gas against the substrate P while transporting and moving the substrate P. In this constitution as well, it is possible to remove the liquid LQ that has adhered to the front surface or the rear surface of the substrate P, as well as the liquid that has adhered to the second arm member H2.

Furthermore, when blowing gas from the gas blow nozzles against the rear surface of the substrate P, gas is blown in the present embodiment from a direction orthogonal to the rear surface of the substrate P, but may be blown from a direction that intersects the rear surface (a oblique direction, e.g., 45°).

The following explains the second liquid removal system 220, which is provided with the transport system H of the present embodiment. The second liquid removal system 220 is principally for the purpose of removing the liquid LQ that has adhered to the surface of the second arm member H2. As shown in FIG. 1 and FIG. 2, the second liquid removal system 220 is provided on the movement pathway of the second arm member H2, specifically on the transport pathway of the substrate P between the substrate stage PST and the holding table HT. Namely, in the transport system H of the present embodiment, the second arm member H2 unloads the post-exposure substrate P from the substrate stage PST and transports that substrate P to the holding table, after which the second liquid removal system 220 removes the liquid that has adhered to the second arm member H2.

Figure 15:
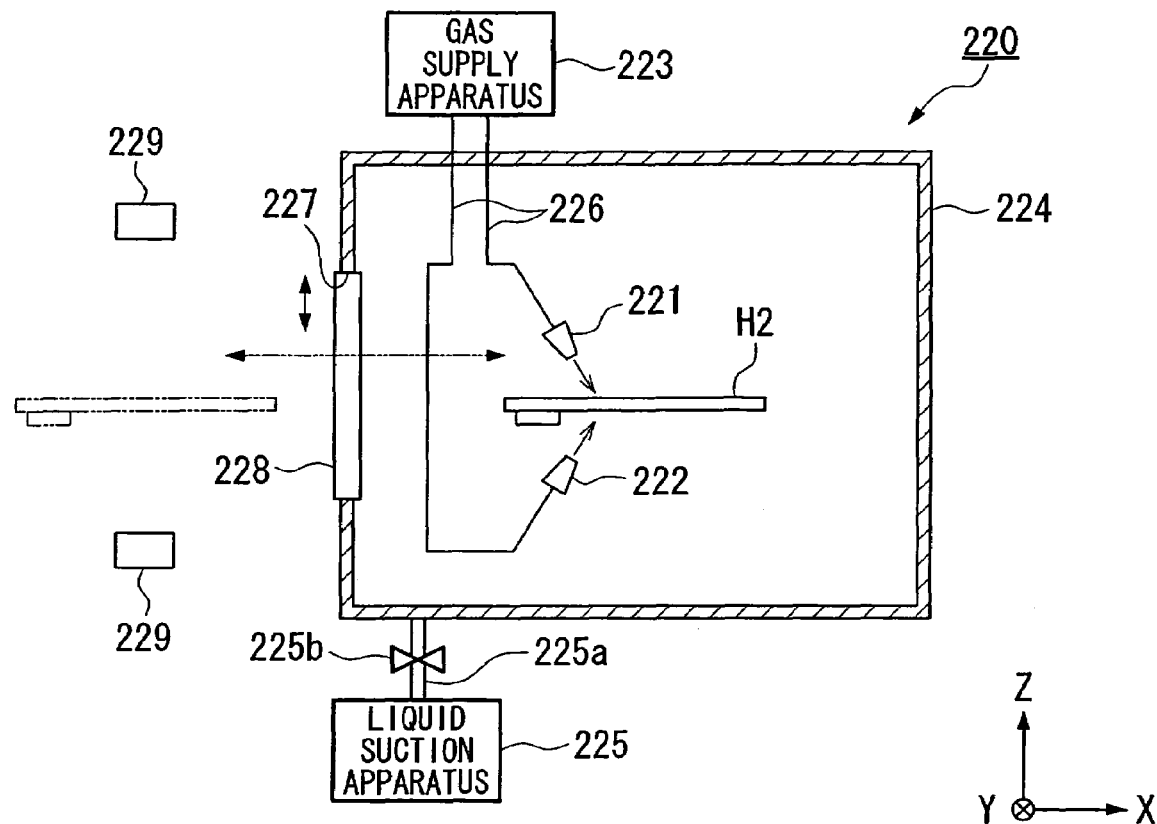
FIG. 15 is a schematic drawing of an exemplary constitution of a second liquid removal system.

FIG. 15 schematically shows an example of the constitution of the second liquid removal system 220.

In FIG. 15, the second liquid removal system 220 is configured to include gas spray parts (first gas spray part 221 and second gas spray part 222) that spray gas against the second arm member H2, a gas supply apparatus 223 that supplies gas to the gas spray parts 221 and 222, a chamber 224 that houses the gas spray parts 221 and 222, and a liquid suction apparatus 225 that sucks the liquid inside the chamber 224.

The first gas spray part 221 sprays gas toward the upper surface of the second arm member H2, and the second gas spray part 222 sprays gas toward the lower surface of the second arm member H2. The first gas spray part 221 and the second gas spray part 222 are disposed mutually spaced apart by a prescribed spacing, and the second arm member H2 is interposed therebetween. In addition, the first gas spray part 221 and the second gas spray part 222 are each connected to the gas supply apparatus 223 via a supply pipe 226. The supply pipe 226 is provided with a filter (not shown) that removes impurities (particles, oil mist, and the like) in the gas. Furthermore, dry air is used as the spray gas in the present embodiment. Other gases may be used as the spray gas, such as nitrogen gas and helium gas.

The liquid suction apparatus 225 generates vacuum pressure and sucks the liquid inside the chamber 224, and is connected to the chamber 224 via a piping 225a. In addition, a valve 225b is openably and closably provided to and disposed in the piping 225a.

An opening 227 is provided to the chamber 224 in order for the second arm member H2 to enter and exit the chamber 224, and a shutter 228 is provided to the opening 227. Furthermore, a liquid detector 229, which detects whether the liquid has adhered to the second arm member H2, is provided outside of the chamber 224 and in the vicinity of the opening 227 of the chamber 224.

If the adherence of liquid to the second arm member H2 has been detected as a result of detection by the liquid detector 229, then the second arm member H2 is inserted into the chamber 224, and the liquid that has adhered to the second arm member H2 is removed; however, if the liquid has not adhered or if adhesion of the liquid is within a permissible range, then the second arm member H2 unloads the substrate P from the substrate stage PST without being inserted into the chamber 224.

In the present embodiment, an imaging device, such as a CCD camera, is used as the liquid detector 229. The image information imaged by the imaging device is sent to the control apparatus CONT (refer to FIG. 1). The control apparatus CONT stores the image information of the second arm member H2 in a state wherein the liquid is not yet adhered. The control apparatus CONT judges whether the liquid has adhered to the second arm member H2 by comparing the current image information with, for example, the image information that was stored in advance. Furthermore, this judgment is not limited to automatic execution, and an operator may judge whether the liquid has adhered to the second arm member H2 by displaying the image information imaged by the imaging device on a monitor and making judgment based on the state of the displayed second arm member H2. Furthermore, the second arm member H2 can be inclined at a prescribed angle when judging whether the liquid has adhered to the second arm member H2.

In addition, the liquid detector 229 is not limited to one that uses an imaging device, and may be one that uses another detector as long as it is capable of detecting the liquid that has adhered to the second arm member H2, e.g., one that includes a light projecting device and a light receiving device, irradiates the second arm member H2 with light, and judges whether the liquid has adhered to the second arm member H2 based on the differential between the intensity of the reflected light, scattered light, and the like from the surface of the second arm member H2 through the liquid, and the intensity of the reflected light, the scattered light, and the like from the surface of the second arm member H2 not through the liquid; one that detects the differential between the permittivity when the liquid has adhered to the surface of the second arm member H2, and the permittivity when the liquid has not adhered to the surface of the second arm member H2; or the like. In addition, the liquid detector 229 is not limited to a noncontact type, and may be a contact type. If a contact type liquid detector is used, then it is preferable to sufficiently carry out cleaning measures so that impurities do not adhere to the second arm member H2 via that detector.

With the transport system H as constituted above, the surface of the second arm member H2, which moves the substrate P along the transport pathway, is appropriately detected by the liquid detector 229. If the adherence of liquid to the second arm member H2 is detected, then the control apparatus CONT (refer to FIG. 1) inserts the second arm member H2 into the chamber 224, and sprays gas from the gas supply apparatus 223 through the gas spray parts 221 and 222 toward the second arm member H2. At this time, by moving the second arm member H2 in the horizontal direction (X direction) relative to the gas spray parts 221 and 222, the liquid that has adhered to the surface of the second arm member H2 is blown off by the sprayed gas, thereby removing the liquid from the second arm member H2. In addition, the liquid that was removed from the second arm member H2 is recovered by the liquid suction apparatus 225 through the piping 225a.

As explained above, the device fabrication system SYS of the present embodiment performs the exposure process in the exposure apparatus main body EX based on the liquid immersion method. The liquid that has adhered to the substrate P during the exposure process is removed from the substrate P by the first liquid removal system 100. In addition, if the liquid has adhered to the second arm member H2 that transports the substrate P after the exposure process, then that liquid is removed from the second arm member H2 by the second liquid removal system 220. The second liquid removal system 220 is provided and disposed on the transport pathway of the second arm member H2. Therefore, when removing the liquid, there is little wasted movement of the second arm member H2, which suppresses deterioration in throughput. The removal of the liquid that has adhered to the second arm member H2 prevents the occurrence of transport problems, such as, for example, when transporting the next substrate P, the slippage of that substrate P on the second arm member H2. As a result, with the present device fabrication system SYS, the substrate P that has been exposed based on the liquid immersion method can be satisfactorily transported and stably processed.

Here, the liquid that has adhered to the second arm member H2 is removed at least at the point before unloading the substrate P from the substrate stage PST. Removing the liquid that has adhered to the second arm member H2 before unloading the substrate reliably prevents transport problems, such as the slippage of the substrate on the second arm member H2.

In addition, the removal of the liquid from the second arm member H2 may be performed after the substrate unload operation is completed by the second arm member H2, in addition to before the transport of the substrate discussed above. Namely, when the second arm member H2 to which the liquid has adhered moves, there is a risk that the scattering of that liquid will cause operational problems, environmental changes, and the like. Consequently, after the handover of the substrate P to the first liquid removal system 100 is complete, the liquid detector 229 verifies whether the liquid has adhered to the second arm member H2; if the liquid LQ has adhered, then the second liquid removal system 220 is used to remove such, thereby enabling the suppression of such problems.

When removing the liquid from the second arm member H2, it is possible to simultaneously remove the liquid that has adhered to at least one of the front surface and the rear surface of the substrate P supported by the second arm member H2. If the liquid that has adhered to at least one of the front surface and the rear surface of the substrate P can be removed, then it is also possible to omit the first liquid removal system 100 discussed above.

In addition, in the present embodiment, the removal of liquid from the second arm member H2 is performed only when needed, based on the detection result of the liquid detector 229, which is advantageous in that it suppresses a deterioration in throughput due to the removal of the liquid. Furthermore, if there is a strong possibility that the liquid has adhered to the second arm member H2, then the operation of detecting the liquid by the liquid detector 229 can be omitted, and the liquid may be continuously removed from the second arm member H2.

Figure 16:
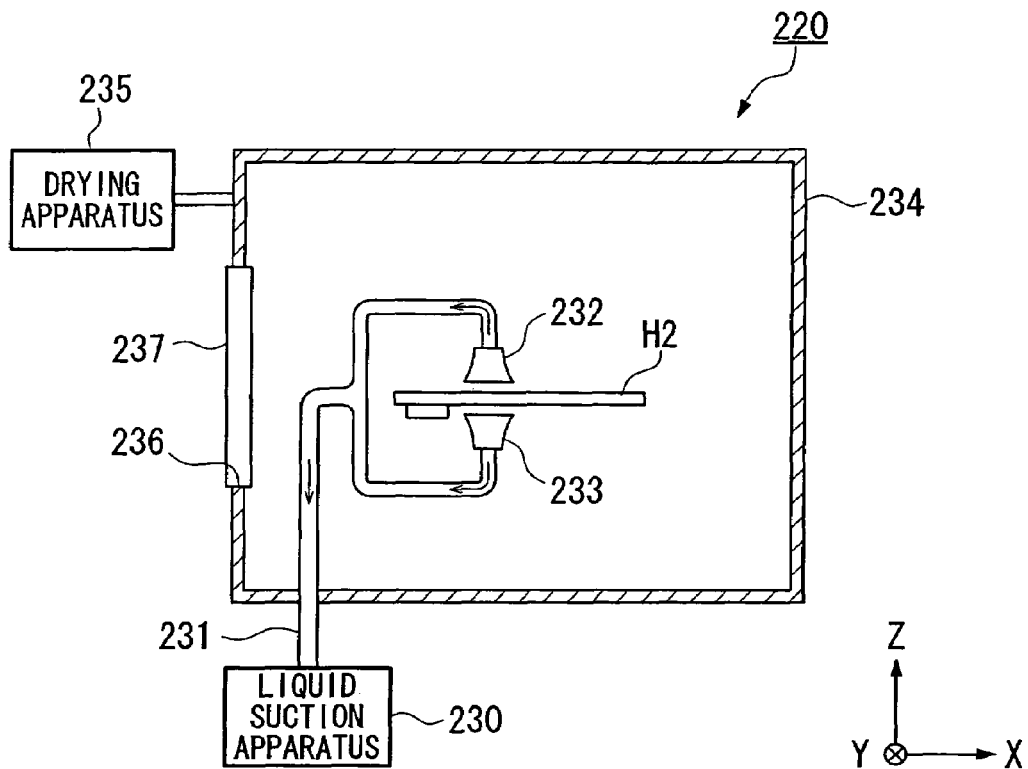
FIG. 16 is a schematic drawing of another exemplary constitution of the second liquid removal system.
Figure 17:
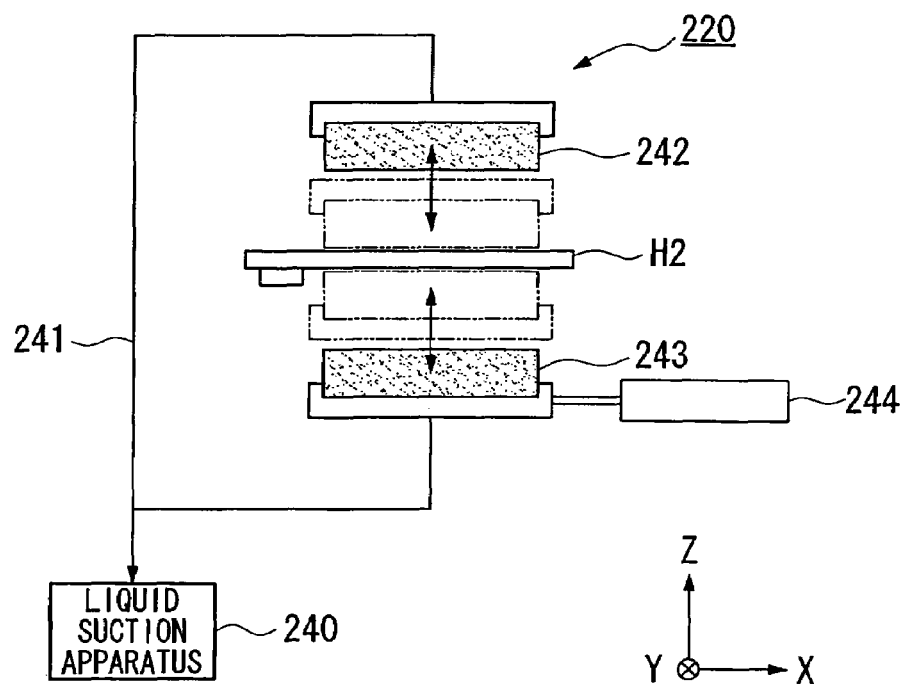
FIG. 17 is a schematic drawing of another exemplary constitution of the second liquid removal system.

FIG. 16 and FIG. 17 show other embodiments of the second liquid removal system 220.

The second liquid removal system 220 in FIG. 16 includes a liquid suction apparatus 230, first and second suction parts 232 and 233 that are connected to the liquid suction apparatus 230 by a piping 231 and that suck the liquid that has adhered to the front surface and the rear surface of the second arm member H2, respectively, and a drying apparatus 235 that dries the interior of a chamber 234. Furthermore, the first and second suction parts 232 and 233 are provided capable of moving in the X axial direction relative to the second arm member H2. In addition, the chamber 234 is provided with an opening 236 so that the second arm member H2 can enter into and exit from the chamber 234, the same as the embodiment in FIG. 15, and a shutter 237 is provided to this opening 236.

When removing the liquid from the second arm member H2 by the second liquid removal system 220 in FIG. 16, the liquid suction apparatus 230 is operated in a state wherein the first and second suction parts 232 and 233 have been brought a position close to the second arm member H2. Thereby, the liquid that has adhered to the second arm member H2 is sucked by the liquid suction apparatus 230 through the first and second suction parts 232 and 233. At this time, the liquid that has adhered to the second arm member H2 is removed by moving the first and second suction parts 232 and 233 and the second arm member H2 relative to one another in the X axial direction.

In addition, with this second liquid removal system 220, dried gas (dry air) is appropriately supplied inside the chamber 234 by the drying apparatus 235. The supplied dry air may be of room temperature, or may be warm gas, the temperature of which is controlled to a prescribed temperature. Supplying dry air dries the interior of the chamber 234, which, as a result, promotes the removal of the liquid from the second arm member H2.

Furthermore, in the second liquid removal system 220 as constituted above, the liquid suction apparatus 230 and the suction parts 232 and 233, and the like may be omitted if the liquid is rapidly removed from the second arm member H2 just by supplying dry air by the drying apparatus 235. In addition, the drying method is not limited to a gas supplying method, and other drying methods may be used, such as a pressure reducing method, an infrared ray irradiating method, and the like.

The second liquid removal system 220 of FIG. 17 includes a liquid suction apparatus 240, moisture absorbing materials 242 and 243 that are connected to the liquid suction apparatus 240 via a piping 241, and a drive apparatus 244 that moves the moisture absorbing materials 242 and 243 in the Z direction. A sponge member, porous ceramics, and the like are used as the moisture absorbing materials 242 and 243.

When removing the liquid from the second arm member H2 with the second liquid removal system 220 in FIG. 17, the drive apparatus 244 tightly contacts the moisture absorbing materials 242 and 243 with the second arm member H2. If the liquid suction apparatus 240 is activated in this state, and the liquid absorbed by the moisture absorbing materials 242 and 243 is recovered, then the liquid that has adhered to the second arm member H2 is removed. By removing the liquid using the moisture absorbing materials 242 and 243, there is little scattering of the liquid. Consequently, it is possible to omit the chamber (casing), which makes the apparatus more compact. Furthermore, if the liquid cannot be removed rapidly from the second arm member H2 by the absorption by the moisture absorbing materials 242 and 243, then the present constitution may be combined with the drying apparatus shown in the previous FIG. 16.

Furthermore, the moisture absorbing material 90 shown in FIG. 11 may be provided with the function of removing the liquid from the arm.

In the present embodiment, if the liquid LQ has adhered to the second arm member H2, then absorption can be executed by the moisture absorbing material 90. Furthermore, the present embodiment may be constituted so that the liquid absorbed by the moisture absorbing material 90 is recovered through the vacuum system 34 that holds the substrate. According to this constitution, the moisture absorbing material 90 constitutes one part of the second arm member H2, which enables the size of the apparatus to be reduced. In addition, it is possible to remove the liquid from the second arm member H2 at an arbitrary position and with an arbitrary timing. For example, the liquid can be removed from the second arm member H2 while moving it. Consequently, it is possible to enhance throughput.

The above-explained embodiment of the constitution of the second liquid removal system 220, but the constitution by which the liquid is removed from the second arm member H2 is not limited to the one discussed above. In addition, the various constitutions discussed above may of course be appropriately combined.

Figure 18:
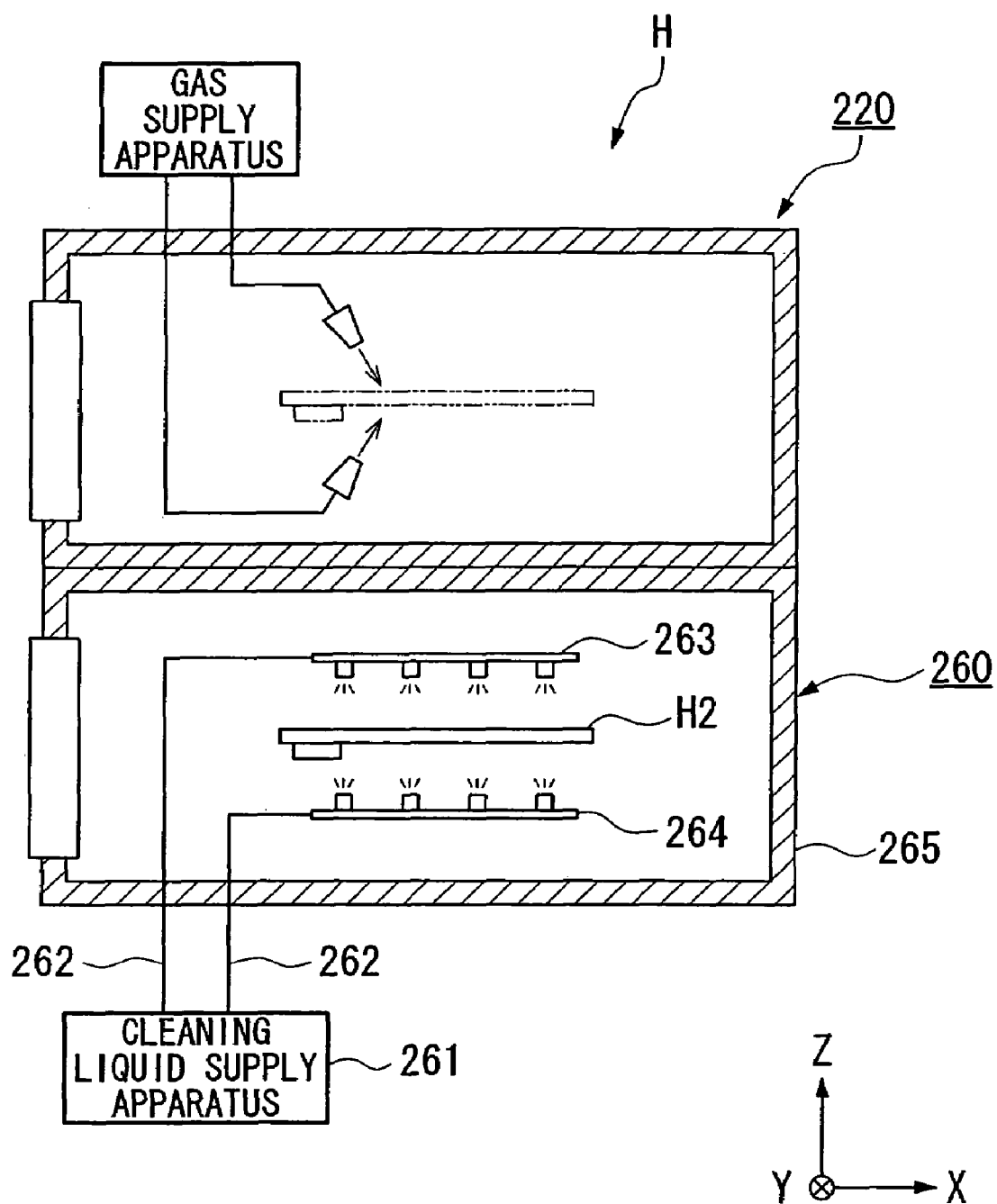
FIG. 18 is a schematic drawing of another embodiment of a transport system provided with the second liquid removal system.

FIG. 18 shows another embodiment of a transport system H provided with the second liquid removal system 220. In FIG. 18, the transport system H includes a cleaning apparatus 260, which cleans the second arm member H2, in addition to the second liquid removal system 220 that removes the liquid that has adhered to the second arm member H2. Furthermore, in the present embodiment, the gas spray type shown in FIG. 15 may be used as the second liquid removal system 220, and any of the constitutional examples explained in the present embodiment may be adapted.

The cleaning apparatus 260 includes a cleaning liquid supply apparatus 261 that supplies cleaning liquid, liquid spray parts 263 and 264, which are connected via a piping 262 to the cleaning liquid supply apparatus 261 and that spray the cleaning liquid toward the second arm member H2, and a chamber 265 that houses the liquid spray parts 263 and 264. In addition to pure water, various chemicals are appropriately used as the cleaning liquid. In addition, the liquid spray parts 263 and 264 are constituted, for example, so that a plurality of spray nozzles are provided to a head portion, which is connected to the cleaning liquid supply apparatus 261. Furthermore, in the constitutional example shown in FIG. 18, the second liquid removal system 220 and the cleaning apparatus 260 are disposed lined up in the vertical direction, but may be disposed lined up in the horizontal direction. Furthermore, the cleaning liquid inside the chamber 265 is appropriately recovered through a recovery piping (not shown).

If the liquid has adhered to the second arm member H2, then there is a possibility that impurities will adhere to the second arm member H2 due to the liquid adhesion. Furthermore, if those impurities remain on the second arm member H2, then there is a risk that, when transporting the next substrate to be exposed, the impurities will adhere to that substrate. With the transport system H in FIG. 18, the post-exposure substrate P, is unloaded from the substrate stage PST by the second arm member H2, that substrate P is transported to the holding table HT, the second arm member H2 is then cleaned in the cleaning apparatus 260, and the liquid that has adhered to the second arm member H2 is subsequently removed by the second liquid removal system 220. Accordingly, with the present transport system H, cleaning the second arm member H2 suppresses the adhesion of impurities to the pre-exposure substrate.

Furthermore, the cleaning method of the second arm member H2 is not limited to the method wherein the cleaning liquid is sprayed, and other methods may be used, such as a method in which the second arm member H2 is immerged in cleaning liquid stored in a tank, an ultrasonic cleaning method, or the like. In addition, the present embodiment is not limited to the use of cleaning liquid, and a so-called optical cleaning method may be used wherein, for example, light (UV light, or the like), ozone, and the like is used. Furthermore, instead of cleaning the second arm member H2 with the unloading of every substrate P, cleaning may be performed with every unloading of a prescribed number of substrates P. In addition, a foreign matter detector that detects foreign matter (impurities) on the surface (including the rear surface and side surfaces) of the second arm member H2 may be provided separate from the liquid detector 229; for example, after the removal of the liquid by the second liquid removal system 220, verification may be executed to verify whether foreign matter has adhered to the second arm member H2 and, if foreign matter has adhered, then the cleaning apparatus 260 may be used to clean the second arm member H2. By suppressing the adhesion of impurities to the substrate before it is exposed, it is possible to enhance exposure accuracy during the exposure process.

Here, with respect to the exposure process by the liquid immersion method, pure water is used in the present embodiment as the liquid LQ used in the exposure process. Pure water can be easily obtained in large quantities at semiconductor fabrication plants or the like, and has an advantage in that it does not adversely affect the photoresist on the substrate P, the optical elements (lenses), and the like. In addition, pure water does not adversely affect the environment and has an extremely low impurity content, and can therefore be expected to also serve the function of cleaning the front surface of the substrate P, as well as the surface of the optical element provided at the tip surface of the projection optical system PL.

Further, because the refractive index n of pure water (water) for the exposure light EL that has a wavelength of approximately 193 nm is substantially 1.44, the use of ArF excimer laser light (193 nm wavelength) as the light source of the exposure light EL would shorten the wavelength on the substrate P to 1/n, i.e., approximately 134 nm, thereby obtaining a high resolution. Furthermore, because the depth of focus will increase approximately n times, i.e., approximately 1.44 times, that of in air, the numerical aperture of the projection optical system PL can be further increased if it is enough to ensure a depth of focus approximately the same as that when used in air, and the resolution is also improved from this standpoint.

In the present embodiment, the lens 2 is attached to the tip of the projection optical system PL; the optical element attached to the tip of the projection optical system PL may be an optical plate that is used to adjust the optical characteristics, e.g., aberrations (spherical aberration, coma aberration, and the like), of the projection optical system PL. Alternatively, the optical element may be a parallel plane plate capable of transmitting the exposure light EL.

Furthermore, if the pressure generated by the flow of the liquid LQ between the optical element at the tip of the projection optical system PL and the substrate P is large, then the optical element may be rigidly fixed so that it does not move due to that pressure, instead of making it exchangeable.

Furthermore, the present embodiment is constituted so that the liquid LQ is filled between the projection optical system PL and the surface of the substrate P, but it may be constituted so that, for example, the liquid LQ is filled in a state wherein a cover glass, comprising a parallel plane plate, is attached to the surface of the substrate P.

Furthermore, although the liquid LQ in the present embodiment is water, it may be a liquid other than water. For example, if the light source of the exposure light EL is an $F_2$ laser, then the $F_2$ laser light will not transmit through water, so it would be acceptable to use a fluorine based fluid, such as perfluorinated polyether (PFPE) or fluorine based oil, which is capable of transmitting $F_2$ laser light, as the liquid LQ. In addition, it is also possible to use as the liquid LQ one (e.g., cedar oil) that is transparent to the exposure light EL, has the highest possible refractive index, and is stable with respect to the projection optical system PL and the photoresist coated on the surface of the substrate P.

Furthermore, the substrate P in each of the abovementioned embodiments is not limited to a semiconductor wafer for fabricating semiconductor devices, and is also applicable to a glass substrate for a display device, a ceramic wafer for a thin film magnetic head, or a mask or original plate of a reticle (synthetic quartz, silicon wafer) used by an exposure apparatus, and the like.

In addition, in the embodiments discussed above, an exposure apparatus is adopted that locally fills the space between the projection optical system PL and the substrate P with the liquid, but the present invention may also be adapted to a liquid immersion exposure apparatus that moves a stage, which holds the substrate to be exposed, in a liquid bath, as disclosed in Japanese Published Unexamined Patent Application No. H6-124873, as well as to a liquid immersion exposure apparatus that forms a liquid pool, which has a prescribed depth, on the stage and holds the substrate therein, as disclosed in Japanese Published Unexamined Patent Application No. H10-303114.

In addition to a step-and-scan system scanning type exposure apparatus (scanning stepper) that scans and exposes the pattern of the mask M by synchronously moving the mask M and the substrate P, the exposure apparatus (exposure apparatus main body) EX may also be adapted to a step-and-repeat system projection exposure apparatus (stepper) that exposes the full pattern of the mask M, with the mask M and the substrate P in a stationary state, and sequentially steps the substrate P. In addition, the present invention is also applicable to a step-and-stitch system exposure apparatus that partially and superimposingly transfers at least two patterns onto the substrate P.

The type of exposure apparatus EX is not limited to semiconductor device fabrication exposure apparatuses that expose the pattern of a semiconductor device on the substrate P, but is also widely applicable to exposure apparatuses for fabricating liquid crystal devices or displays, exposure apparatuses for fabricating thin film magnetic heads, imaging devices (CCD), or reticles and masks, and the like.

The exposure apparatus EX of the embodiments in the present application as described above is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The assembly process from the various subsystems to the exposure apparatus includes the mutual mechanical connection of the various subsystems, the wiring and connection of electrical circuits, the piping and connection of the atmospheric pressure circuit, and the like. Of course, before the process of assembling the exposure apparatus from these various subsystems, there are processes for assembling each of the individual subsystems. When the process of assembling the exposure apparatus from the various subsystems is completed, a comprehensive adjustment is performed to ensure the various accuracies of the exposure apparatus as a whole. Furthermore, it is preferable to manufacture the exposure apparatus in a clean room wherein the temperature, the cleanliness level, and the like are controlled.

Figure 19:
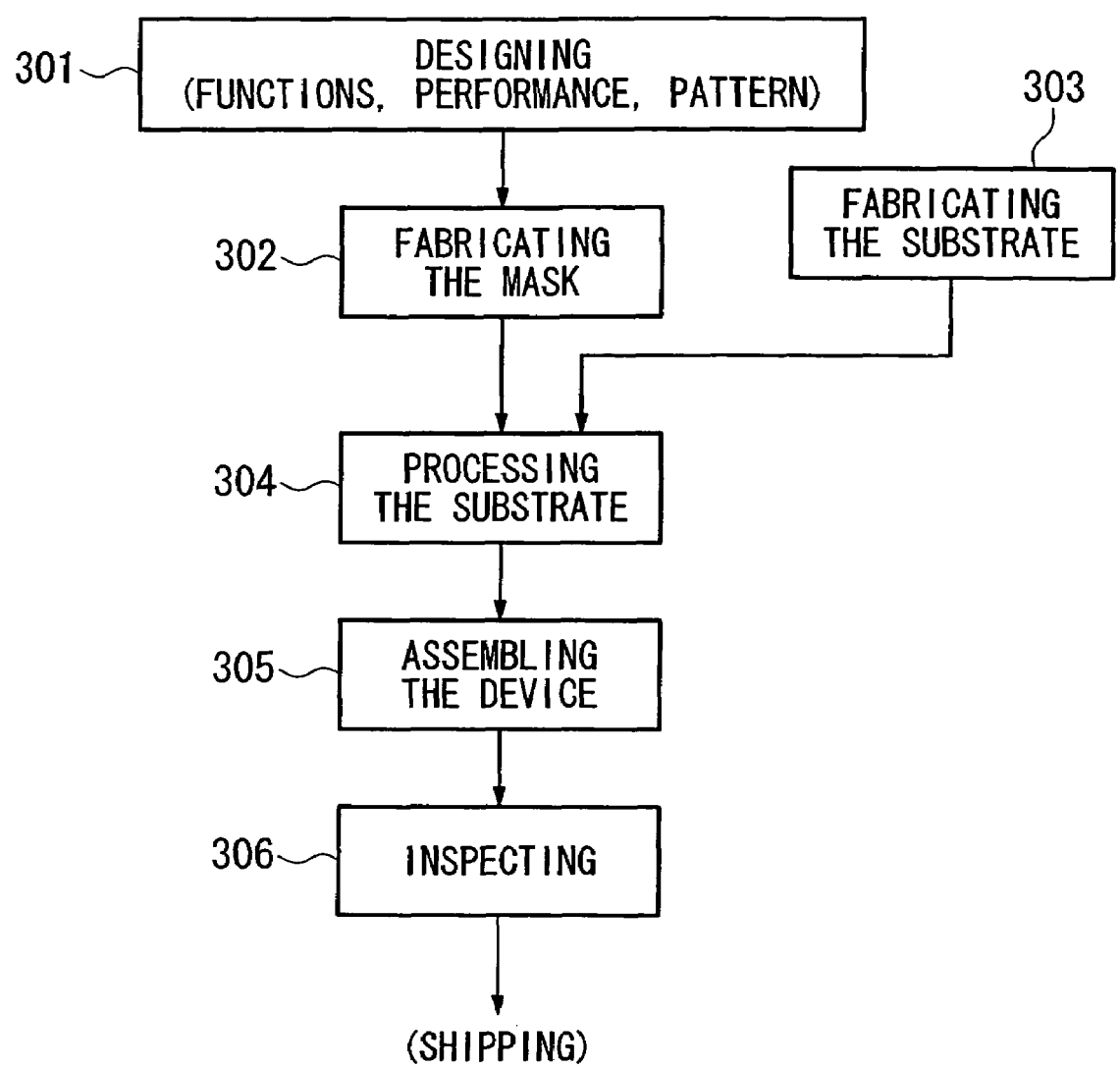
FIG. 19 is a flow chart that shows one example of the process of fabricating a semiconductor device.

As shown in FIG. 19, a micro-device, such as a semiconductor device, is manufactured by: a step 301 that designs the functions and performance/characteristics of the micro-device; a step 302 that fabricates a mask (reticle) based on this design step; a step 303 that fabricates a substrate, which is the base material of the device; an exposure processing step 304 wherein the exposure apparatus EX of the embodiments discussed above exposes a pattern of the mask onto the substrate; a device assembling step 305 (comprising a dicing process, a bonding process, and a packaging process); an inspecting step 306; and the like.

The preferred embodiments according to the present invention were explained above, referencing the attached drawings, but the present invention is of course not limited to these embodiments. It is clear that one of ordinary skill in the art can conceive of various modifications and changes within the field of the technical ideas as recited in the claims, and it is understood that such modifications also pertain to the technical scope of the present invention.

What is claimed is:

1. A substrate transport apparatus that transports a substrate that has been exposed with an image of a pattern via a projection optical system and a liquid, the substrate transport apparatus comprising:
    a substrate support member that supports the substrate by contacting a rear surface of the substrate; and
    a liquid removal mechanism that removes the liquid that has adhered to at least a portion of the rear surface of the substrate, the liquid removal mechanism including:
        at least one opening in the substrate support member that opposes the rear surface of the substrate and that blows a gas toward the rear surface of the substrate to remove the liquid from the at least a portion of the rear surface, and
        a control apparatus that causes the at least one opening to blow the gas toward the rear surface of the substrate while the rear surface of the substrate is positioned opposed to and spaced above the substrate support member before the substrate support member supports the substrate.

2. A substrate transport apparatus as recited in claim 1, wherein
    the substrate support member is a substrate transport member that transports the substrate.

3. A substrate transport apparatus as recited in claim 2, further comprising:
    a liquid detector that detects whether the liquid has adhered to the substrate transport member;
    wherein,
    the liquid removal mechanism removes the liquid that has adhered to the substrate transport member based on a detection result of the liquid detector.

4. A substrate transport apparatus as recited in claim 2, wherein
    the at least one opening also blows gas against the substrate transport member.

5. A substrate transport apparatus as recited in claim 2, wherein
    the liquid removal mechanism has a moisture absorbing material that absorbs the liquid that has adhered to the substrate transport member.

6. A substrate transport apparatus as recited in claim 2, wherein
    the liquid removal mechanism sucks the liquid that has adhered to the substrate transport member.

7. A substrate transport apparatus as recited in claim 2, wherein
    the liquid removal mechanism dries the liquid that has adhered to the substrate transport member.

8. A substrate transport apparatus as recited in claim 2, wherein
    the liquid removal mechanism removes the liquid that has adhered to the substrate transport member and the liquid that has adhered to at least a portion of the rear surface of the substrate.

9. A substrate transport apparatus as recited in claim 2, further comprising:
    a cleaning apparatus that cleans the substrate transport member.

10. A substrate transport apparatus as recited in claim 2, wherein
    the liquid removal mechanism is provided on a movement pathway of the substrate transport member.

11. A substrate transport apparatus as recited in claim 2, wherein
    the substrate transport member includes the at least one opening that opposes the rear surface of the substrate.

12. A substrate transport apparatus as recited in claim 11, further comprising:
    a suction mechanism that sucks the rear surface of the substrate through the at least one opening to cause the substrate to be supported by the substrate transport member by contacting the rear surface of the substrate; and
    a connection mechanism that selectively connects a source of the gas that blows toward the rear surface and the suction mechanism to the opening.

13. A substrate transport apparatus as recited in claim 2, further comprising:
   a suction mechanism that sucks the rear surface of the substrate to cause the substrate transport member to support the substrate via the rear surface of the substrate; wherein,
   the substrate transport member has at least one first opening, which is connected to the suction mechanism and opposes the rear surface of the substrate, and at least one second opening, which opposes the rear surface of the substrate and is provided at a position different from the first opening; and
   the gas that blows against the rear surface of the substrate is blown through the second opening.

14. A substrate transport apparatus as recited in claim 1, wherein
   the liquid removal mechanism includes a moisture absorbing material that absorbs the liquid that has adhered to at least a portion of the area of the rear surface of the substrate.

15. A substrate transport apparatus as recited in claim 1, further comprising:
   a liquid removal system that is provided on the transport pathway of the substrate, and that removes liquid that has adhered to the front surface of the substrate.

16. A substrate transport apparatus as recited in claim 15, wherein
   the liquid removal system has a drying mechanism that dries the liquid that has adhered to the front surface of the substrate, or a rotary mechanism that flings off liquid that has adhered to the front surface of the substrate by rotating the substrate.

17. A substrate transport apparatus as recited in claim 1, further comprising:
   a holding table that is provided on a transport pathway of the substrate and that temporarily holds the substrate; wherein,
   the substrate support member and the liquid removal mechanism are provided to the holding table.

18. An exposure apparatus that exposes a substrate by projecting an image of a pattern onto the substrate, which is held by a substrate stage, through the projection optical system and a liquid, wherein
   the substrate is transported from the substrate stage by using a substrate transport apparatus as recited in claim 1.

* * * * *